US012635246B2

(12) United States Patent
Ikeda

(10) Patent No.: US 12,635,246 B2
(45) Date of Patent: May 19, 2026

(54) DISPLAY DEVICE

(71) Applicant: Japan Display Inc., Tokyo (JP)

(72) Inventor: Masanobu Ikeda, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 324 days.

(21) Appl. No.: 18/203,672

(22) Filed: May 31, 2023

(65) Prior Publication Data

US 2023/0411403 A1     Dec. 21, 2023

(30) Foreign Application Priority Data

Jun. 21, 2022    (JP) ................................. 2022-099786

(51) Int. Cl.
| | |
|---|---|
| *H01L 29/205* | (2006.01) |
| *H01L 25/16* | (2023.01) |
| *H01L 33/00* | (2010.01) |
| *H10D 86/40* | (2025.01) |
| *H10D 86/60* | (2025.01) |
| *H10H 20/858* | (2025.01) |

(52) U.S. Cl.
CPC ........... *H10D 86/60* (2025.01); *H01L 25/167* (2013.01); *H10D 86/441* (2025.01); *H10H 20/8582* (2025.01)

(58) Field of Classification Search
CPC ....... H10D 86/441; H05K 2201/10128; H05K 1/189
See application file for complete search history.

(56) References Cited

U.S. PATENT DOCUMENTS

| | | | | |
|---|---|---|---|---|
| 2015/0349131 A1* | 12/2015 | Atsumi | ................ | H10D 86/441 |
| | | | | 257/43 |
| 2017/0271431 A1* | 9/2017 | Miyake | ................... | H01L 24/50 |
| 2021/0167266 A1 | 6/2021 | Ikeda et al. | | |
| 2021/0225815 A1* | 7/2021 | Bower | ................ | H10H 20/851 |
| 2022/0293579 A1 | 9/2022 | Ogawa et al. | | |

FOREIGN PATENT DOCUMENTS

| | | |
|---|---|---|
| JP | 2013-030433 A | 2/2013 |
| WO | 2020/017303 A1 | 1/2020 |
| WO | 2021/111783 A1 | 6/2021 |

* cited by examiner

*Primary Examiner* — Ismail A Muse
(74) *Attorney, Agent, or Firm* — XSENSUS LLP

(57) ABSTRACT

A display device includes a first substrate including a first surface and a second surface opposite to the first surface, a first LED chip included in a first pixel, a first FPC, and a first wiring connected to the first LED chip and the first FPC being arranged on the second surface, and a second substrate including a third surface and a fourth surface opposite to the third surface, a second LED chip included in a second pixel, a second FPC, and a second wiring connected to the second LED chip and the second FPC being arranged on the fourth surface. The second surface faces the third surface, the second wiring overlaps the first wiring, and the second LED chip and the first LED chip are arranged side-by-side in a plan view.

19 Claims, 26 Drawing Sheets

DISPLAY DEVICE

CROSS-REFERENCE TO RELATED APPLICATION

This application claims the benefit of priority to Japanese Patent Application No. 2022-099786 filed on Jun. 21, 2022, the entire contents of which are incorporated herein by reference.

FIELD

An embodiment of the present invention relates to a display device.

BACKGROUND

In recent years, a display device in which each of a plurality of pixels includes a light-emitting element has attracted attention. For example, the light-emitting element is a light-emitting diode (LED), a minute light-emitting diode (micro LED), an organic electroluminescence (Electro Luminescence: EL) electrode, or the like. The display device including the light-emitting element can control the light emission intensity or brightness of the light-emitting element by a current flowing through the light-emitting element, and can display an image (picture).

For example, WO 2021/111783 and WO 2020/017303 disclose a display device (hereinafter referred to as LED display device) in which the micro LED is used as a pixel. In addition, Japanese laid-open patent publication No. 2013-30433 discloses an LED substrate in which two adjacent side edges opposed to each other are arranged in a state adjacent along the adjacent direction, and a connector to which a harness for power source connection is connected is arranged on the adjacent side edges.

SUMMARY

One embodiment of the present invention is a display device including a first substrate including a first surface and a second surface opposite to the first surface, a first LED chip included in a first pixel, a first FPC, and a first wiring connected to the first LED chip and the first FPC being arranged on the second surface; and a second substrate including a third surface and a fourth surface opposite to the third surface, a second LED chip included in a second pixel, a second FPC, and a second wiring connected to the second LED chip and the second FPC being arranged on the fourth surface; wherein the second surface faces the third surface, the second wiring overlaps the first wiring, and the second LED chip and the first LED chip are arranged side-by-side in a plan view.

DESCRIPTION OF EMBODIMENTS

Figure 1:
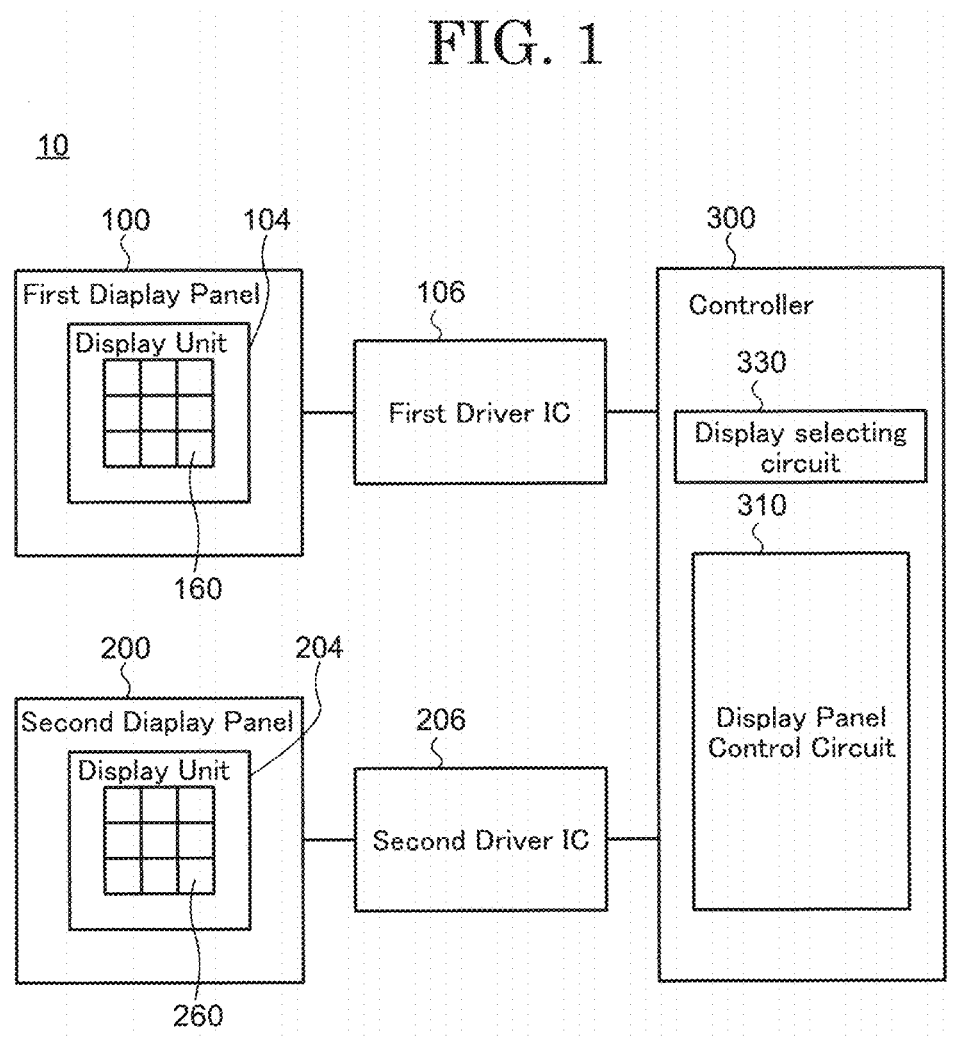
FIG. 1 is a schematic plan view showing a configuration of a display device according to a first embodiment of the present invention.

Hereinafter, embodiments of the present invention will be described with reference to the drawings and the like. However, the present invention can be implemented in many different aspects, and should not be construed as being limited to the description of the embodiments exemplified below.

In order to make the description clearer, although the drawings may be schematically represented with respect to configurations and the like of the respective parts as compared with actual embodiments, they are merely examples, and do not limit the interpretation of the present invention.

In the specification and the drawings of the present application, the same symbols (or symbols with a, b, A, B, and the like after a number) are given to the same elements as those described above with respect to the previous drawings, and detailed explanation thereof may be omitted as appropriate. In addition, the terms "first" and "second" appended to each element are convenience signs used to distinguish each element, and do not have any further meaning unless otherwise specified.

In the present specification, the case where a certain member or area is "on (or under)" another member or area includes, unless otherwise limited, the case where they are directly above (or below) the other member or area, and the case where they are above (or below) the other member or area. That is, it includes the case where another component is included between a certain member or area and the upper (or lower) of another member or area.

In the present specification, the phrase "a includes A, B, or C," "a includes any of A, B, and C," "a includes one selected from a group consisting of A, B, and C," and the like does not exclude the case where a includes a plurality of combinations of A to C unless otherwise indicated. Furthermore, these expressions do not exclude the case where a includes other elements.

In the present specification, a direction X intersects a direction Y, and a direction Z intersects the direction X and the direction Y (X-Y plane). The direction X is referred to as a first direction, the direction Y is referred to as a second direction, and the direction Z is referred to as a third direction.

In the specification of the present application, when expressions such as the same and match are used, it includes the case where errors within the scope of the design are included.

In the present specification, in a first display panel, each layer such as an insulating layer, a semiconductor layer, and a conductive layer or each element such as a transistor and a light-emitting element are arranged on a second surface, and in a second display panel, each layer such as an insulating layer, a semiconductor layer, and a conductive layer or each element such as a transistor and a light-emitting element are arranged on a fourth surface. In the following explanation, unless otherwise specified, in the cross-sectional view of the first display panel, the side on which the light-emitting element is arranged with respect to the second surface is referred to as "on" or "upper surface", and the opposite side is referred to as "below" or "lower surface", and in the cross-sectional view of the second display panel, the side on which the light-emitting element is arranged with respect to the fourth surface is referred to as "on" or "upper surface", and the opposite side is referred to as "below" or "lower surface". In addition, the second display panel is arranged "on" the first display panel.

For example, in an LED display device, it is required to increase the brightness and the definition. For example, in order to increase the brightness in the LED display device, a current flowing through the LED needs to be increased. For example, in order to increase the definition in the LED display device, the LED needs to be arranged at a high density in advance. However, as the current flowing through the LED increases, the LED generates heat due to increasing non-luminous recombination reactions, and the luminous efficacy of the LED decreases. As the current flowing through the LED increases in a state where the density of the LED is increased, the decrease in the luminous efficacy of the LED due to the temperature-rise becomes more remarkable. As a result of the decrease in the luminous efficacy of the LED, it is difficult to improve the brightness corresponding to the amount of current flow through the LED display device.

In view of such problems, an object of an embodiment of the present invention is to provide a display device having a higher brightness and a higher definition.

In the specification and claims of the present application, a display device that is one embodiment is, a display device that uses an LED as the light-emitting element.

First Embodiment

[1. Overall Configuration of Display Device 10]

Figure 2:
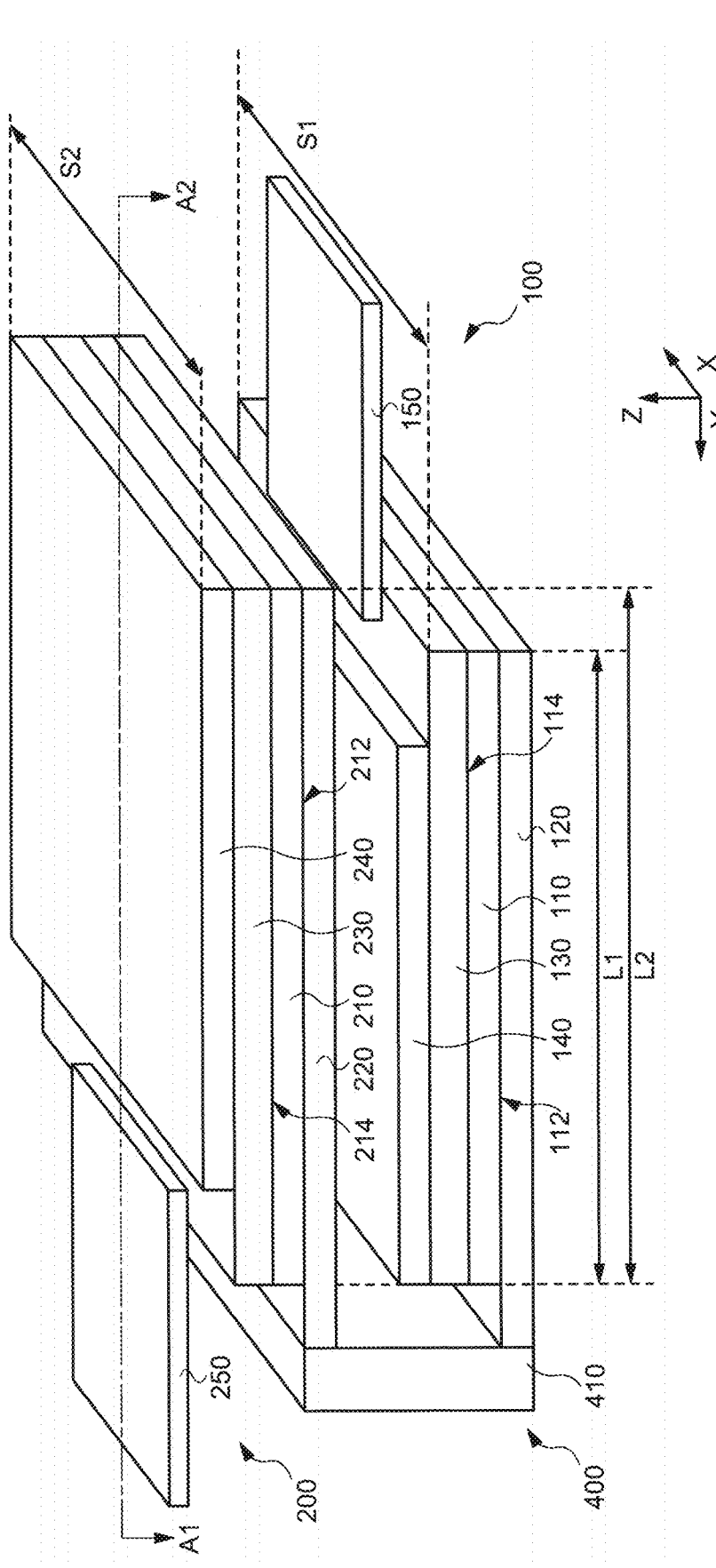
FIG. 2 is a schematic perspective view showing a configuration of a display device according to the first embodiment of the present invention.
Figure 3:
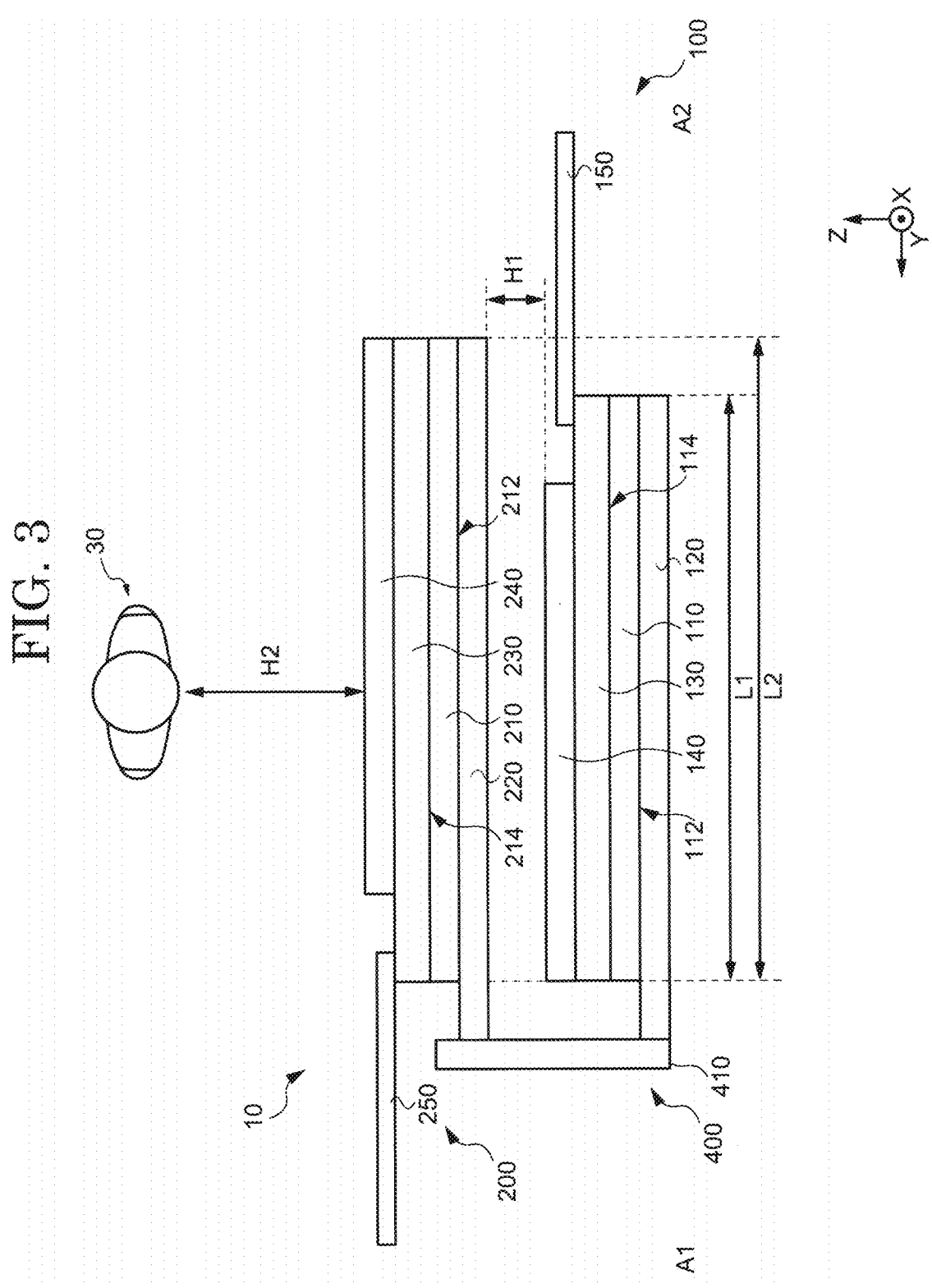
FIG. 3 is a diagram schematically showing a cross-sectional view showing a cut surface along a line A1-A2 of a display device shown in FIG. 2, and an observer.

FIG. 1 is a schematic perspective view showing a configuration of a display device 10 according to a first embodiment of the present invention, and FIG. 2 is a schematic perspective view showing a configuration of the display device 10. FIG. 3 is a diagram schematically showing a cross-sectional view showing a cut surface along a line A1-A2 of the display device 10 shown in FIG. 2, and an observer.

As shown in FIG. 1, FIG. 2, or FIG. 3, the display device 10 includes a first display panel 100, a first driver IC 106, a second display panel 200, a second driver IC 206, a control device 300, and a housing 400.

The second display panel 200 is arranged above the first display panel 100. That is, the first display panel 100 and the second display panel 200 are arranged in the direction Z. In the direction Z, a distance between the first display panel 100 and the second display panel 200 is a distance H1. In addition, a distance between an observer 30 and the display device 10 is a distance H2.

A length of a side of the first display panel 100 in the direction X is a length S1, and a length of a side in the direction Y is a length L1. A length of a side of the second display panel 200 in the direction X is a length S2, and a length of a side in the direction Y is a length L2. The length S1 is the same as the length S2, and the length L1 is shorter than the length L2. That is, an outer diameter dimension of the second display panel 200 is greater than an outer diameter dimension of the first display panel 100. In addition, the outer diameter dimension of the second display panel 200 may be the same as the outer diameter dimension of the first display panel 100.

The first display panel 100 includes a display unit 104 including a plurality of pixels PIX1 (see FIG. 4) and is electrically connected to the first driver IC 106. In addition, the first display panel 100 includes a substrate 110 including a first surface 112 and a second surface 114 opposite the first surface 112, a low reflection heat dissipation layer 120 arranged on the first surface 112, an array layer 130 arranged on the second surface 114, an insulating layer 140 and an FPC 150 arranged above the array layer 130. That is, in the first display panel 100, the low reflection heat dissipation layer 120, the substrate 110, the array layer 130, and the insulating layer 140 are stacked in the direction Z in this order. In addition, the FPC 150 is arranged at an end of the first display panel 100 on the second surface 114 side. The low reflection heat dissipation layer 120 may be referred to as a first heat dissipation layer, and the insulating layer 140 may be referred to as a second heat dissipation layer.

The second display panel 200 includes a display unit 204 including a plurality of pixels PIX2 (see FIG. 7) and is electrically connected to the second driver IC 206. In addition, the second display panel 200 includes a substrate 210 including a first surface 212 and a second surface 214 opposite the first surface 212, a low reflection heat dissipation layer 220 arranged on the first surface 212, an array layer 230 arranged on the second surface 214, an insulating layer 240 and an FPC 250 arranged above the array layer 230. That is, in the second display panel 200, the low reflection heat dissipation layer 220, the substrate 210, the array layer 230, and the insulating layer 240 are stacked in the direction Z in this order. In addition, the FPC 250 is arranged at an end of the second display panel 200 on the second surface 214 side. The first surface 212 may be referred to as a third surface, the second surface 214 may be referred to as a fourth surface, the low reflection heat dissipation layer 220 may be referred to as a third heat dissipation layer, and the insulating layer 240 may be referred to as a fourth heat dissipation layer.

The control device 300 includes a display panel control circuit 310 and a display selection circuit 330. Although the details will be described later, the pixel PIX1 and the pixel PIX2 include the light-emitting element. The control device 300 supplies a signal and a power source voltage to the first driver IC 106, the second driver IC 206, a scanning signal line driving circuit 108, a scanning signal line driving circuit 208, and the like, and controls the display of a picture on the first display panel 100 and the second display panel 200.

The housing 400 includes a side wall 410. The low reflection heat dissipation layer 120 and the low reflection heat dissipation layer 220 are connected to the side wall 410. Although not shown, the low reflection heat dissipation layer 120 and the low reflection heat dissipation layer 220 are connected to the side wall 410 using, for example, metal clips, wirings, and solder. To simplify the explanation of the display device 10, although not shown, the housing 400 includes side walls arranged on three sides other than the side on which the side wall 410 is arranged, and is configured to surround four sides of the low reflection heat dissipation layer 120 and the low reflection heat dissipation layer 220. The sidewalls arranged on three sides other than the side on which the side wall 410 is arranged have the same configuration and function as the side wall 410, and are connected to the low reflection heat dissipation layer 120 and the low reflection heat dissipation layer 220.

Heat generated with the display on the first display panel 100 and the second display panel 200 is able to dissipated to the housing 400 through the low reflection heat dissipation layer 120 and the low reflection heat dissipation layer 220 in the display device 10. That is, the display device 10 has a configuration in which heat is dissipated (a configuration capable of heat dissipation). In addition, the display device 10 has the configuration capable of heat dissipation, so that it is possible to suppress a decrease in luminous efficacy of each light-emitting element due to the heat generated with the display on the first display panel 100 and the second display panel 200. Furthermore, since the display device 10 has the configuration capable of heat dissipation, more current can be supplied to each light-emitting element than before, and the brightness of the light-emitting element can be set high.

In addition, in the display device 10, the FPC 250 is arranged on the opposite side of the FPC 150 in the direction Y. The FPC 250 does not overlap the FPC 150. Since the FPC 250 and the FPC 150 do not overlap each other as compared with the case where the FPC 250 and the FPC 150 overlap each other, it is possible to suppress the heat generated with the display on the first display panel 100 and the second display panel 200 from being concentrated in the vicinity of the FPC.

The low reflection heat dissipation layers 220 overlaps the FPC 150 and the FPC 250. In addition, a length of the low reflection heat dissipation layer 220 in the direction X is longer than a length of the low reflection heat dissipation layer 120 in the direction X and a length of the insulating layer 140 in the direction X. That is, as described above, in the display device 10, the outer diameter dimension of the second display panel 200 is larger than the outer diameter dimension of the first display panel 100. As a result, the second display panel 200 may overlap the FPC 150 and hide the FPC 150.

[2. Configurations of First Display Panel 100 and Control Device 300]

Figure 4:
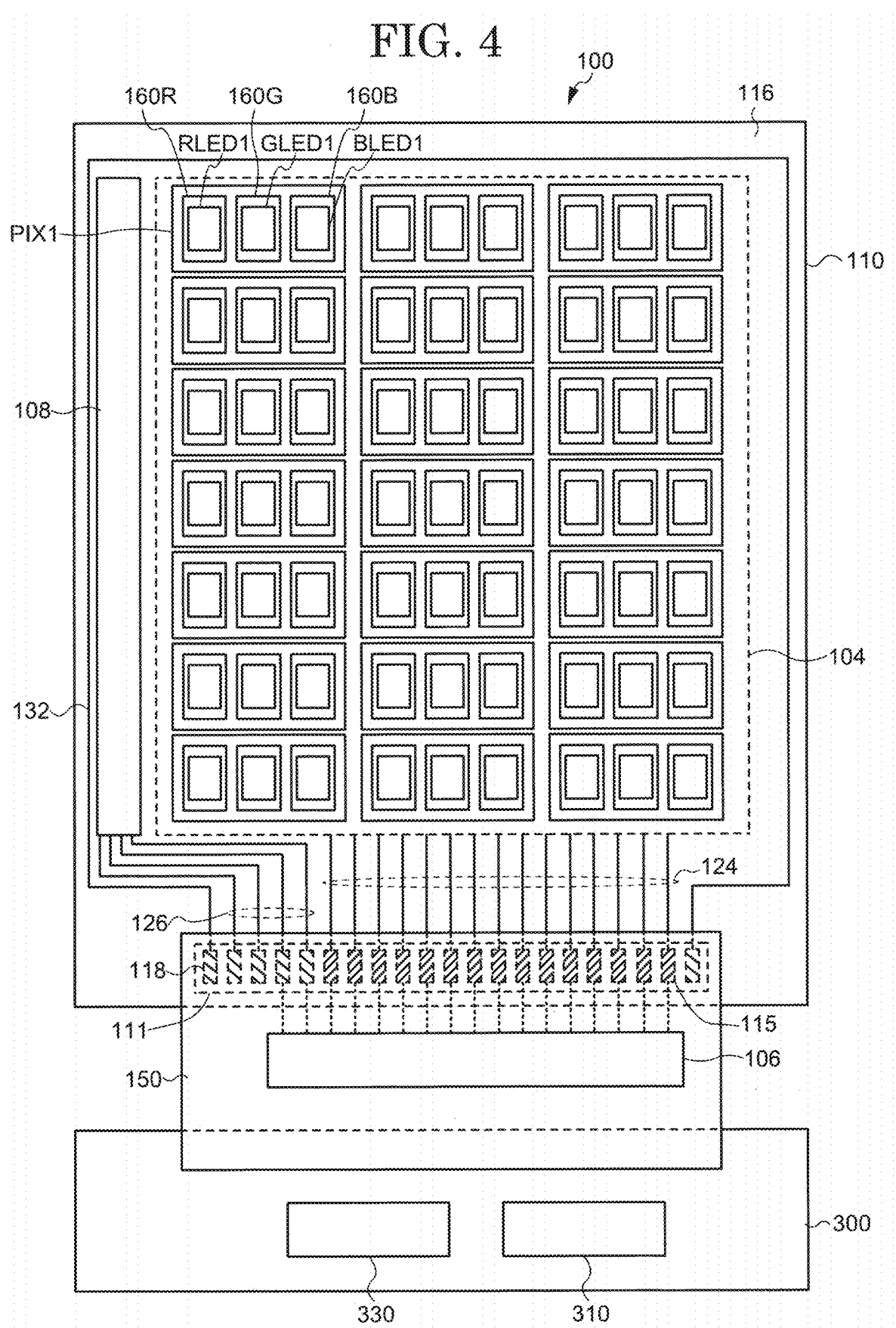
FIG. 4 is a schematic plan view showing configurations of a first display panel and a control device according to the first embodiment of the present invention.
Figure 5:
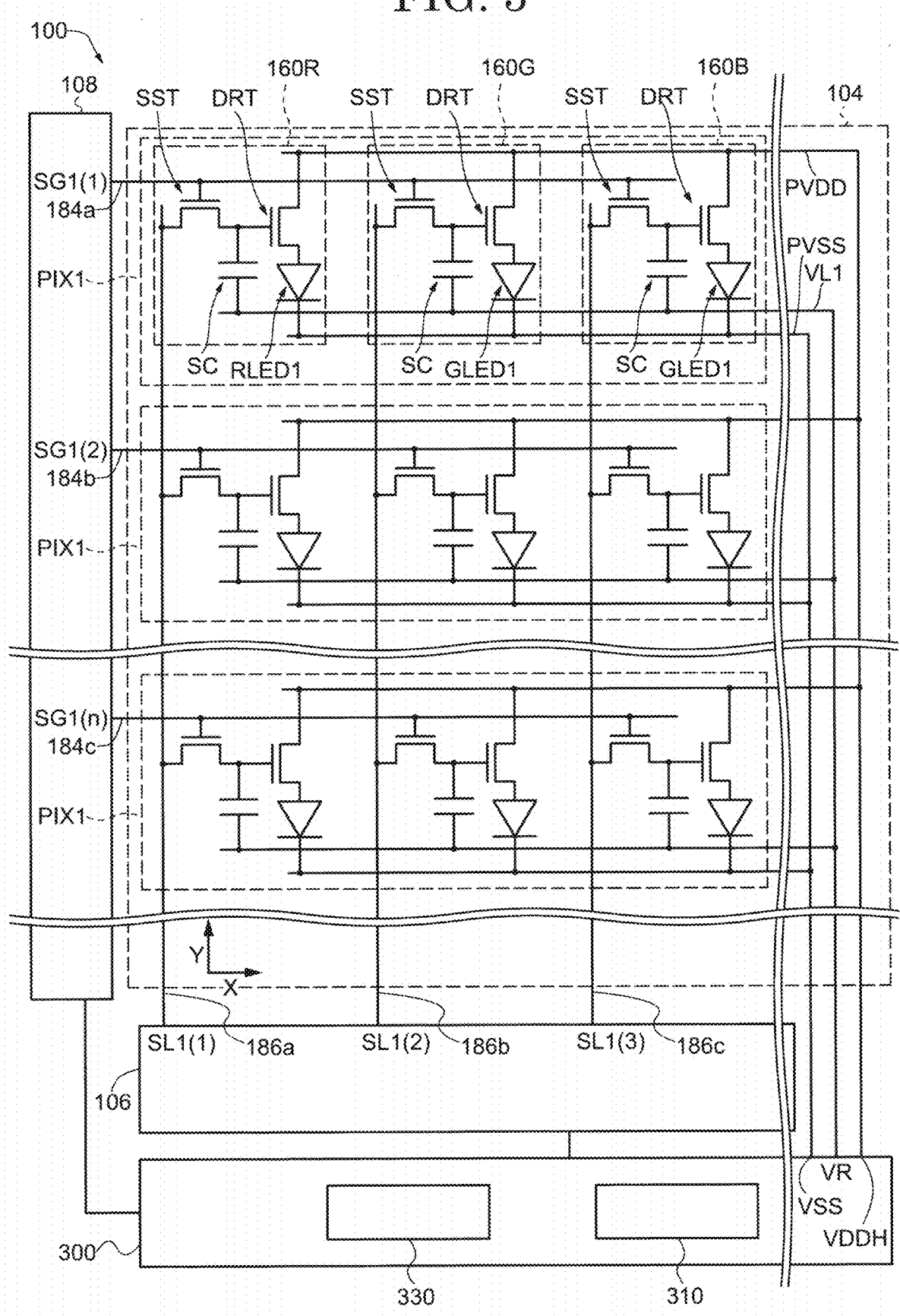
FIG. 5 is a schematic plan view showing configurations of the first display panel and the control device according to the first embodiment of the present invention.
Figure 6:
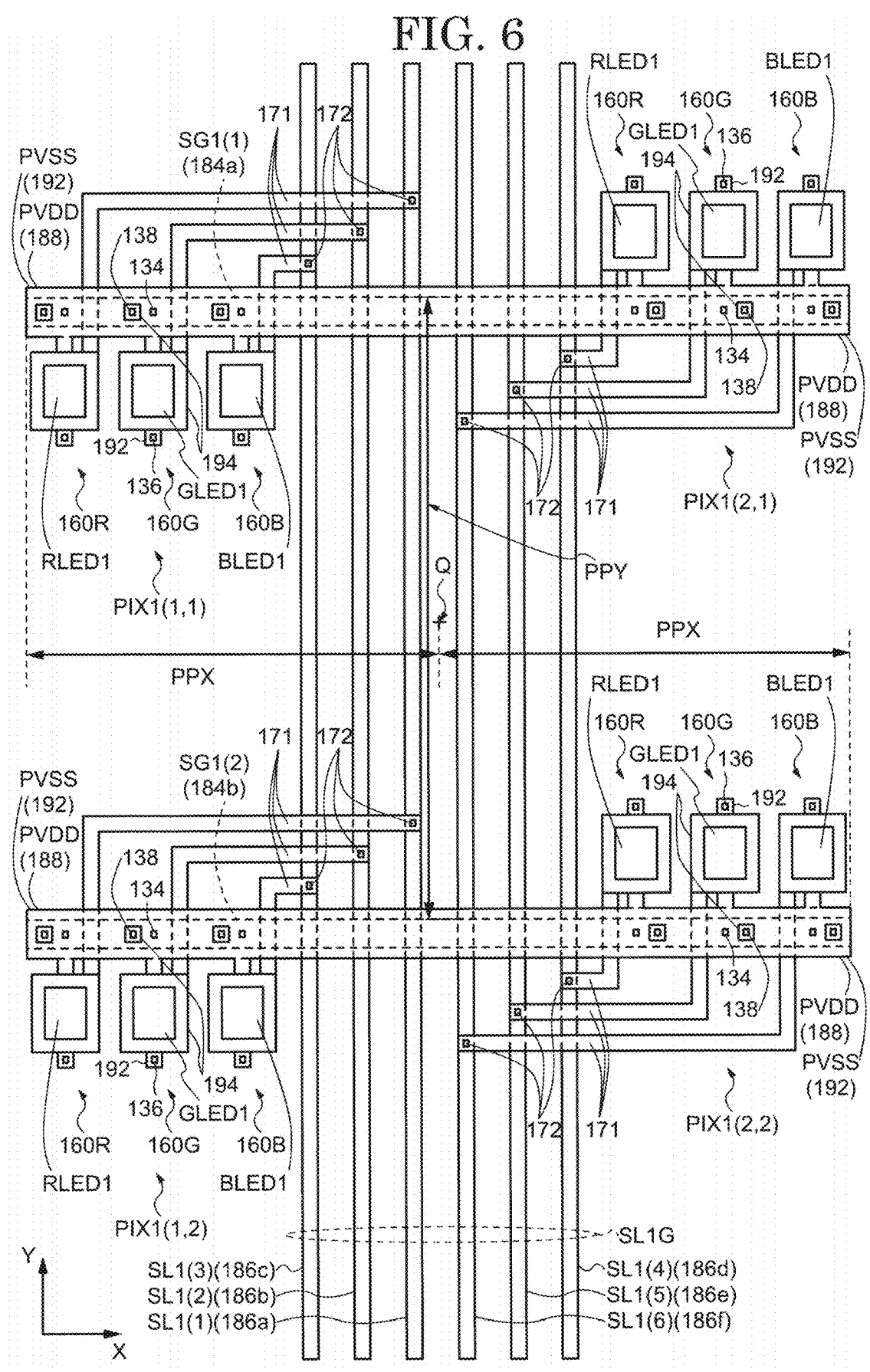
FIG. 6 is a schematic plan view showing configurations of a plurality of pixels and wirings included in the first display panel according to the first embodiment of the present invention.

FIG. 4 and FIG. 5 are schematic plan views showing configurations of the first display panel 100 and the control device 300. FIG. 6 is a schematic plan view showing a configuration of the plurality of pixels PIX1 and wirings (video signal lines 186a to 186f) included in the first display panel 100. Descriptions of the same or similar configurations as those in FIG. 1 to FIG. 3 will be omitted.

First, block configurations of the first display panel 100 and the control device 300 will be described with reference to FIG. 4. As shown in FIG. 4, the first display panel 100 is roughly divided into the display unit 104 and a peripheral portion 116. The first display panel 100 includes the substrate 110, the first driver IC 106, the scanning signal line driving circuit 108, the FPC 150, the plurality of pixels PIX1, a wiring 124, and a wiring 126.

As described above, the display unit 104 includes the plurality of pixels PIX1. The peripheral portion 116 includes the first driver IC 106, the scanning signal line driving circuit 108, a terminal portion 111, the FPC 150, and a plurality of wirings 124. The display unit 104 and the peripheral portion 116 include a plurality of wirings 126. The terminal portion 111 includes a plurality of terminals 115 and a plurality of terminals 118. The scanning signal line driving circuit 108, the plurality of terminals 115, the plurality of terminals 118, and the plurality of pixels PIX1 are arranged on the second surface 114 (see FIG. 2) of the substrate 110. The first driver IC 106 is arranged on an upper surface of the FPC 150.

The plurality of pixels PIX1 is arranged in a matrix in the direction X and the direction Y. Each of the plurality of pixels PIX1 includes a plurality of sub-pixels 160R, 160G, and 160B. For example, the sub-pixel 160R has a light-emitting element RLED1 that emits red light, the sub-pixel 160G has a light-emitting element GLED1 that emits green light, and the sub-pixel 160B has a light-emitting element BLED1 that emits blue light. In the display device 10, each of the light-emitting elements RLED1, GLED1, and BLED1 may be referred to as an LED chip.

The plurality of wirings 124 is arranged between the display unit 104 and the plurality of terminals 115. The plurality of wirings 126 is arranged between the scanning signal line driving circuit 108 and the plurality of terminals 118. In addition, in the display device 10, a wiring 132 may be arranged to surround the display unit 104 and the scanning signal line driving circuit 108.

The first driver IC 106 may be arranged on the second surface 114 (see FIG. 2 and FIG. 3), and part or all of the driving circuits included in the first driver IC 106 may be formed directly on the second surface 114. In addition, part or all of the driving circuits included in the scanning signal line driving circuit 108 may be formed on a circuit substrate different from the substrate 110, and the circuit substrate may be arranged on the upper surface of the FPC 150.

The plurality of wirings 124 is electrically connected to the plurality of sub-pixels 160R, 160G, and 160B. In addition, the plurality of wirings 124 is electrically connected to the plurality of terminals 115 one-to-one. The plurality of wirings 126 is electrically connected to the scanning signal line driving circuit 108. In addition, the plurality of wirings 126 is electrically connected to the plurality of terminals 118 one-to-one. The first driver IC 106 is electrically connected to the plurality of terminals 115. The terminal portion 111 (the plurality of terminals 115 and the plurality of terminals 118) is electrically connected to the FPC 150 and is electrically connected to the control device 300. For example, the wiring 132 is electrically connected to the plurality of terminals 118.

The scanning signal line driving circuit 108 and the first drivers IC 106 are electrically connected to the control device 300. The scanning signal line driving circuit 108 and the first driver IC 106 use the signal and the power source voltage supplied from the control device 300 to drive the transistor (see FIG. 5) included in each pixel PIX1, and for example, to cause the light-emitting element RLED1 to emit light or not to emit light. As a result, the first display panel 100 can display an image (picture) on the display unit 104.

Next, electrical connections between the first display panel 100 and the control device 300 will be described with reference to FIG. 5. As shown in FIG. 5, the first driver IC 106 is electrically connected to the video signal lines 186a to 186c. For example, the video signal lines 186a to 186c are the wiring 124 (see FIG. 4). Video signals SL1 (1) to SL1 (3) are supplied to the video signal lines 186a to 186c, respectively. For example, the first driver IC 106 commonly supplies a video signal SL1 ($m$) to the plurality of pixels PIX1 located in the m-th column in the display unit 104. A voltage supplied as the video signal SL1 ($m$) is referred to as a voltage Vsig1 ($m$) or a voltage Vsig1 ($n$). The voltage Vsig1 ($m$) and the voltage Vsig1 ($n$) are determined based on the image (picture) displayed on the display unit 104. The numerical value m is an arbitrary integer of 3 or more, and the numerical value n is an arbitrary integer of 1 or more.

The scanning signal line driving circuit 108 is electrically connected to scanning signal lines 184a to 184c. Scanning signals SG1 (1) to SG1 ($n$) are supplied to the scanning signal lines 184a to 184c, respectively. For example, the scanning signal line driving circuit 108 commonly supplies the scanning signal SG1 ($n$) to the plurality of pixels PIX1 located in the n-th row in the display unit 104.

The control device 300 and the plurality of pixels PIX1 are electrically connected to a reset signal line VL1, a reference potential line PVSS, and a drive power supply line PVDD. For example, the reset signal line VL1, the reference potential line PVSS, and the drive power supply line PVDD. For example, the reset signal line VL1, the reference potential line PVSS, and the drive power supply line PVDD are the wiring 132 (see FIG. 4). The reset signal line VL1 supplies a voltage VR. The reference potential line PVSS supplies a reference potential VSS. The drive power supply line PVDD supplies a drive voltage VDDH. The control device 300 commonly supplies the voltage VR, the reference potential VSS, and the drive voltage VDDH to the plurality of pixels PIX1 in the display unit 104.

In the display device 10, as an example, the voltage VR is smaller than the reference potential VSS and the drive voltage VDDH. In the display device 10, although the voltage VR is a fixed voltage as an example, the voltage VR may change over time. The voltage VR may be referred to as a reset voltage or an initialization voltage.

[3. Configuration of Pixel Circuit]

Next, a configuration of the pixel circuit will be described with reference to FIG. 5. Each of the sub-pixel 160R, the sub-pixel 160G, and the sub-pixel 160B includes a pixel circuit. In the sub-pixel 160R, the sub-pixel 160G, and the sub-pixel 160B, configurations other than the light-emitting element and a video signal SL1 ($n$) are the same. In the following description, a configuration of a pixel circuit of the sub-pixel 160R will be mainly described, and configurations of pixel circuits of the sub-pixel 160G and the sub-pixel 160B will not be described.

The sub-pixel 160R includes at least a drive transistor DRT, a select transistor SST, a capacity element SC, and the light-emitting element RLED1. The drive transistor DRT and the select transistor SST include a first electrode (gate electrode) and a pair of electrodes (a source electrode and a drain electrode) consisting of a second electrode and a third electrode. The capacity element SC has a pair of electrodes.

The gate electrode of the select transistor SST is electrically connected to the scanning signal line 184a. The source electrode of the select transistor SST is electrically connected to the video signal line 186a. The drain electrode of the select transistor SST is electrically connected to the gate electrode of the drive transistor DRT and the first electrode of the capacity element SC. The drain electrode of the drive transistor DRT is electrically connected to the drive power supply line PVDD. The source electrode of the drive transistor DRT is electrically connected to the first electrode of the light-emitting element RLED1. The second electrode of the capacity element SC is electrically connected to the reset signal line VL1. The second electrode of the light-emitting element RLED1 is electrically connected to the reference potential line PVSS. For example, the reference potential line PVSS is electrically connected to a cathode electrode.

The select transistor SST has a function of supplying the video signal SL1 ($m$) to the drive transistor DRT. The drive transistor DRT has a function of causing a current to flow through the light-emitting element RLED1 by using the input video signal SL1 ($m$) and causing the light-emitting element RLED1 to emit light. The capacity element SC has a function of holding a charge (first charge) corresponding to a threshold voltage of the drive transistor DRT. In addition, the capacity element SC has a function of holding a charge (second charge) corresponding to the video signal SL1 ($m$) (the voltage Vsig1 ($m$)) input to the gate electrode of the drive transistor DRT for the sub-pixel 160R to emit light. The light-emitting element RLED1 has diode characteristics.

[4. Example of Driving of Pixel Circuit]

Next, an example of driving of the pixel circuit will be described. The scanning signal line driving circuit 108 controls the plurality of scanning signal lines. For example, the scanning signal line driving circuit 108 selects the scanning signal line 184a and supplies the scanning signal SG1 (1) to the scanning signal line 184a. The first driver IC 106 controls the plurality of video signal lines. For example, the first driver IC 106 supplies the video signal SL1 (1) to the video signal line 186a. The control device 300 supplies the drive voltage VDDH to the drive power supply line PVDD, supplies a reference voltage VSS to the reference potential line PVSS, and supplies the voltage VR to the reset signal line VL1.

In the case where the signal supplied to the scanning signal SG1 (1) is at an L-level, the select transistor SST is in a non-conductive state. In the case where the signal supplied to the scanning signal SG1 (1) is at an H level, the select transistor SST is in a conductive state.

In the case where the H-level signal is supplied to the scanning signal SG1 (1), and the select transistor SST becomes the conductive state, the charge (second charge) is accumulated (held) in the capacity element SC based on the voltage Vsig1 (1) of the video signal SL1 (1). A voltage (voltage between GD) between the gate electrode and the drain electrode of the drive transistor DRT is determined according to the amount of charges (second amount of charges) accumulated (held) in a capacity element CS.

The voltage between GD is determined, and a current corresponding to the voltage between GD flows from the drive power supply line PVDD to the reference potential line PVSS. That is, a current corresponding to the voltage between GD flows through the drive transistor DRT. The current corresponding to the voltage between GD of the drive transistor DRT also flows to the light-emitting element RLED1. As a result, the light-emitting element RLED1 emits light with a brightness corresponding to the current.

The L-level signal is supplied to the scanning signal SG1 (1), and the select transistor SST becomes the non-conductive state. Even when the select transistor SST becomes the non-conductive state, since the capacity element CS holds the charge (second charge), the current corresponding to the voltage between GD of the drive transistor DRT flows from the drive power supply line PVDD to the reference potential line PVSS. That is, the current corresponding to the voltage between GD of the drive transistor DRT is supplied to the light-emitting element RLED1.

In addition, in the first display panel 100, "conductive state" is assumed to indicate a state in which the source electrode and the drain electrode of the transistor are in conduction and the transistor is in an on (ON) state, and "non-conductive state" is assumed to indicate a state in which the source electrode and the drain electrode of the transistor are in non-conduction and the transistor is in an off (OFF) state. The source electrode and the drain electrode of each transistor may be interchanged depending on a voltage or a potential supplied to each electrode. In addition, those skilled in the art will readily appreciate that even when the transistor is in the off state, a slight current flows, such as a leakage current.

In addition, a channel region of each transistor shown in FIG. 5 may include Group 14 elements, such as silicon or germanium, or an oxide material having semiconducting properties. For example, the channel area of each transistor has low-temperature polysilicon (LTPS). In the first display panel 100, each transistor is formed using a thin film transistor (TFT) and has an n-channel field-effect transistor. Each of transistors may include the n-channel field-effect transistors or a p-channel field-effect transistors, and may include only the p-channel field-effect transistors. The configuration of the transistor, the connection of the storage capacitor, the power source voltage, and the like for the first display panel 100 may be appropriately adapted according to the application and specifications.

[5. Configuration Example of Pixel PIX1]

Next, a configuration example of the pixel PIX1 in a plan view will be described. FIG. 6 is a schematic plan view showing configurations of the plurality of pixels PIX1 and wirings included in the first display panel 100. In FIG. 6, among the plurality of pixels PIX1 arranged in the display unit 104, an enlarged view of four pixels PIX1 arranged in two rows and two columns is shown. Specifically, as shown in FIG. 6, a pixel PIX1 (1, 1) and a pixel PIX1 (2, 1) are arranged in the direction X. A pixel PIX1 (1, 2) and a pixel PIX1 (2, 2) are arranged in the direction X. In addition, the pixel PIX1 (1, 1) and the pixel PIX1 (1, 2) are arranged in the direction Y. The pixel PIX1 (2, 1) and the pixel PIX1 (2, 2) are arranged in the direction Y. In the case where each pixel does not need to be described separately, the pixels are simply referred to as the pixel PIX1.

The plurality of pixels PIX1 includes the light-emitting element RLED1 (the sub-pixel 160R), the light-emitting element GLED1 (the sub-pixel 160G), and the light-emitting element BLED1 (the sub-pixel 160B), respectively. The pixel PIX1 (1, 1) and the pixel PIX1 (2, 1) are electrically connected to the scanning signal line 184a, and the scanning signal SG1 (1) is supplied to the pixel PIX1 (1, 1) and the pixel PIX1 (2, 1). The pixel PIX1 (1, 2) and the pixel PIX1 (2, 2) are electrically connected to the scanning signal line 184b, and a scanning signal SG1 (2) is supplied to the pixel PIX1 (1, 2) and the pixel PIX1 (2, 2). The pixel PIX1 (1, 1) and the pixel PIX1 (1, 2) are electrically connected to the video signal lines 186a, 186b, and 186c, and the video signals SL1 (1), SL1 (2), and SL1 (3) are supplied to the pixel PIX1 (1, 1) and the pixel PIX1 (1, 2). The pixel PIX1 (2, 1) and the pixel PIX1 (2, 2) are electrically connected to the video signal lines 186d, 186e, and 186f, and video signals SL1 (4), SL1 (5), and SL1 (6) are supplied to the pixel PIX1 (2, 1) and the pixel PIX1 (2, 2).

In the first display panel 100, the plurality of light-emitting elements and the plurality of video signal lines 186a to 186f (a signal line group SL1G) are gathered at two pixels PIX1 adjacent in the direction X, and arranged nearby. One pixel PIX1 of the adjacent pixels and the other pixel PIX1 are arranged in a positional relationship to be inverted with an imaginary line parallel to the direction Y as a symmetrical axis. Alternatively, the pixel PIX1 (1, 1), the pixel PIX1 (2, 1), the pixel PIX1 (1, 2), and the pixel PIX1 (2, 2) are arranged so as to be point-symmetric with respect to a point Q. Specifically, in the case where the pixel PIX1 (1, 1), the pixel PIX1 (2, 1), the pixel PIX1 (1, 2), and the pixel PIX1 (2, 2) are rotated by 180 degrees about the point Q, they are arranged such that the pixel PIX1 (1, 1) overlaps the pixel PIX1 (2, 2), and the pixel PIX1 (2, 1) overlaps the pixel PIX1 (1, 2).

The two pixels PIX1 (for example, the pixel PIX1 (2, 2) and the pixel PIX1 (3, 2) (not shown)) adjacent to each other in the direction X are an area surrounded by two signal line groups SL1G adjacent to each other in the direction X and two scanning signal lines 184b and 184c (not shown) adjacent to each other in the direction Y. In this case, an arrangement pitch PPX+PPX of the pixel PIX1 (2, 2) and the pixel PIX1 (3, 2) in the direction X is the same as an arrangement pitch PPX+PPX of the pixel PIX1 (2, 1) and the pixel PIX1 (2, 2) in the direction X, and is the same as an arrangement pitch PPX+PPX of the signal line group SL1G adjacent in the direction X. In addition, in the display device 10, the arrangement pitch may be referred to as a pixel pitch.

An arrangement pitch PPY of the pixel PIX1 in the direction Y is the same as an arrangement pitch of the scanning signal lines 184b and 184c adjacent to each other in the direction Y and an arrangement pitch of the scanning signal lines 184a and 184b adjacent to each other in the direction Y.

Next, a configuration of each pixel PIX1 will be described by focusing on the pixel PIX1 (1, 1) and the pixel PIX1 (2, 1) adjacent to each other in the direction X. In the following explanation, one side of the direction X (the right direction in FIG. 6) may be referred to as a direction +X, and the other side of the direction X (the left direction in FIG. 6) may be referred to as a direction −X. Similarly, one side of the direction Y (upper direction in FIG. 6) may be referred to as a direction +Y, and the other side of the direction Y (lower direction in FIG. 5) may be referred to as a direction −Y.

The signal line group SL1G includes the plurality of video signal lines 186a to 186f adjacent to each other in the direction X. Specifically, the signal line group SL1G includes six video signal lines 186a, 186b, 186c, 186d, 186e and 186f, which are arranged adjacent in the X direction and arranged together. Three video signal lines 186a to 186c of the six video signal lines are connected to the pixel PIX1 (1, 1) (first pixel) shown in the left side of FIG. 5, and three video signal lines 186d to 186f of the six video signal lines are connected to the pixel PIX1 (2, 1) (second pixel) shown in the left side of FIG. 5. The signal line group SL1G is arranged in the direction X in the order of the video signal line 186c (the video signal SL1 (3)), the video signal line 186b (the video signal SL1 (2)), the video signal line 186a (the video signal SL1 (1)), the video signal line 186f (the video signal SL1 (6)), the video signal line 186e (the video signal SL1 (5)), and the video signal line 186d (the video signal SL1 (4)). In addition, the arrangement of the video signal line is not limited to the arrangement shown in FIG. 6, and may be changed as appropriate according to the specifications and applications.

In each of the plurality of pixels PIX1, the light-emitting element RLED1, the light-emitting element GLED1, and the light-emitting element BLED1 are arranged adjacent to each other in the direction X, and are arranged in the vicinity of the intersection between the video signal line group SL1G and the scanning signal line 184a. Specifically, in the direction X, the signal line group SL1G is arranged between the light-emitting element RLED1, the light-emitting element GLED1, and the light-emitting element BLED1 included in the pixel PIX1 (1, 1) and the light-emitting element RLED1, the light-emitting element GLED1, and the light-emitting element RLED1 included in the pixel PIX1 (2, 1). In addition, in the direction Y, the scanning signal line 184a intersecting the video signal line group SL1G is arranged between the light-emitting element RLED1, the light-emitting element GLED1, and the light-emitting element BLED1 included in the pixel PIX1 (1, 1) and the light-emitting element RLED1, the light-emitting element GLED1, and the light-emitting element BLED1 included in the pixel PIX1 (2, 1).

The light-emitting element RLED1, the light-emitting element GLED1, and the light-emitting element BLED1 included in the pixel PIX1 (1, 1) are arranged in the direction X in this order. The light-emitting element RLED1, the light-emitting element GLED1, and the light-emitting element BLED1 are arranged adjacent to the video signal line group SL1G in the direction X (direction −X). In addition, the light-emitting element RLED1, the light-emitting element GLED1, and the light-emitting element BLED1 included in the pixel PIX1 (1, 1) are arranged adjacent to each other in the direction X in the direction −Y of the scanning signal line 184a intersecting the video signal line group SL1G.

The light-emitting element RLED1, the light-emitting element GLED1, and the light-emitting element BLED1 included in the pixel PIX1 (2, 1) are arranged in the direction X in this order, and the light-emitting element RLED1, the light-emitting element GLED1, and the light-emitting element BLED1 are arranged adjacent to the video signal line group SL1G in the direction X (direction +X). In addition, the light-emitting element RLED1, the light-emitting element GLED1, and the light-emitting element BLED1 included in the pixel PIX1 (2, 1) are arranged adjacent to each other in the direction X in the direction +Y of the scanning signal line 184a intersecting the video signal line group SL1G.

The light-emitting element RLED1, the light-emitting element GLED1, and the light-emitting element BLED1 included in the pixel PIX1 (1, 1) and the light-emitting element RLED1, the light-emitting element GLED1, and the light-emitting element BLED1 included in the pixel PIX1 (2, 1) are arranged in the same manner in the direction X. In addition, the arrangement of the light-emitting element RLED1, the light-emitting element GLED1, and the light-emitting element BLED1 shown in FIG. 6 (the order of the arrangement in the direction X) is an example, and the arrangement of the light-emitting element RLED1, the light-emitting element GLED1, and the light-emitting element BLED1 is not limited to the arrangement shown in FIG. 6. The arrangement of the light-emitting element RLED1, the light-emitting element GLED1, and the light-emitting element BLED1 may be different for each pixel PIX1.

The sub-pixel 160R, the sub-pixel 160G, and the sub-pixel 160B included in the pixel PIX1 are electrically connected to the corresponding video signal lines 186a to 186f via a semiconductor layer 171 forming the select transistor SST and a contact hole 172, respectively. In addition, each light-emitting element included in the pixel PIX1 is electrically connected to the drive power supply line PVDD via a contact hole 134, and is electrically connected to the reference potential line PVSS via a contact hole 138. The drive power supply line PVDD and the reference potential line PVSS are arranged to overlap the scanning signal line 184a and extend in the direction X. In FIG. 6, the drive power supply line PVDD and the reference potential line PVSS are represented by dashed lines for the sake of clarity.

The light-emitting element RLED1, the light-emitting element GLED1, and the light-emitting element BLED1 included in the pixel PIX1 are electrically connected to a fifth conductive layer 194 (for example, a junction electrode 194a (see FIG. 12)). The fifth conductive layer 194 is electrically connected to a fourth conductive layer 192 via a contact hole 136. Although the details will be described later, the fourth conductive layer 192 is electrically connected to the drain electrode of the drive transistor DRT via a plurality of conductive layers and contact holes.

[6. Configurations of Second Display Panel 200 and Control Device 300]

Figure 7:
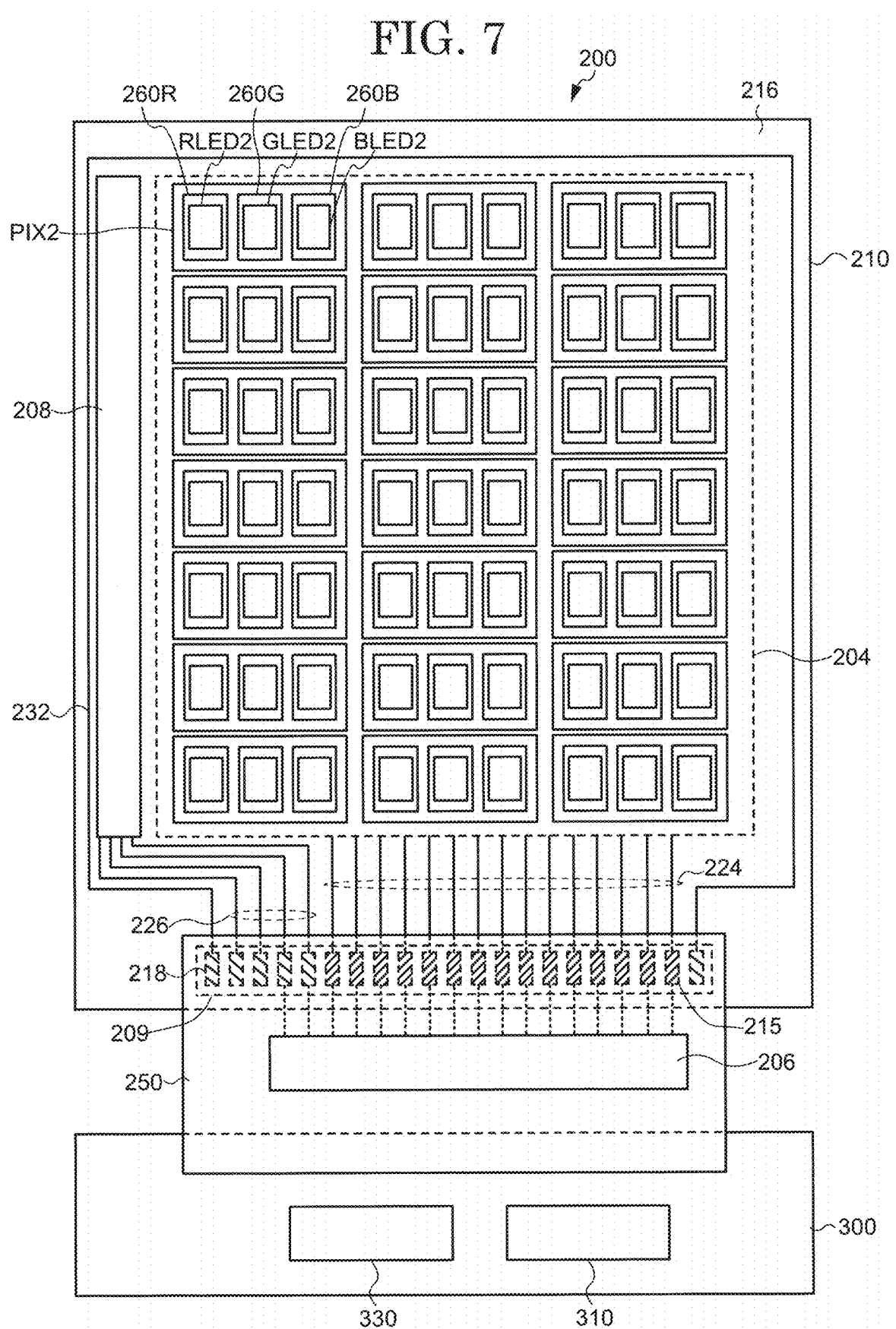
FIG. 7 is a schematic plan view showing configurations of a second display panel and a control device according to the first embodiment of the present invention.
Figure 8:
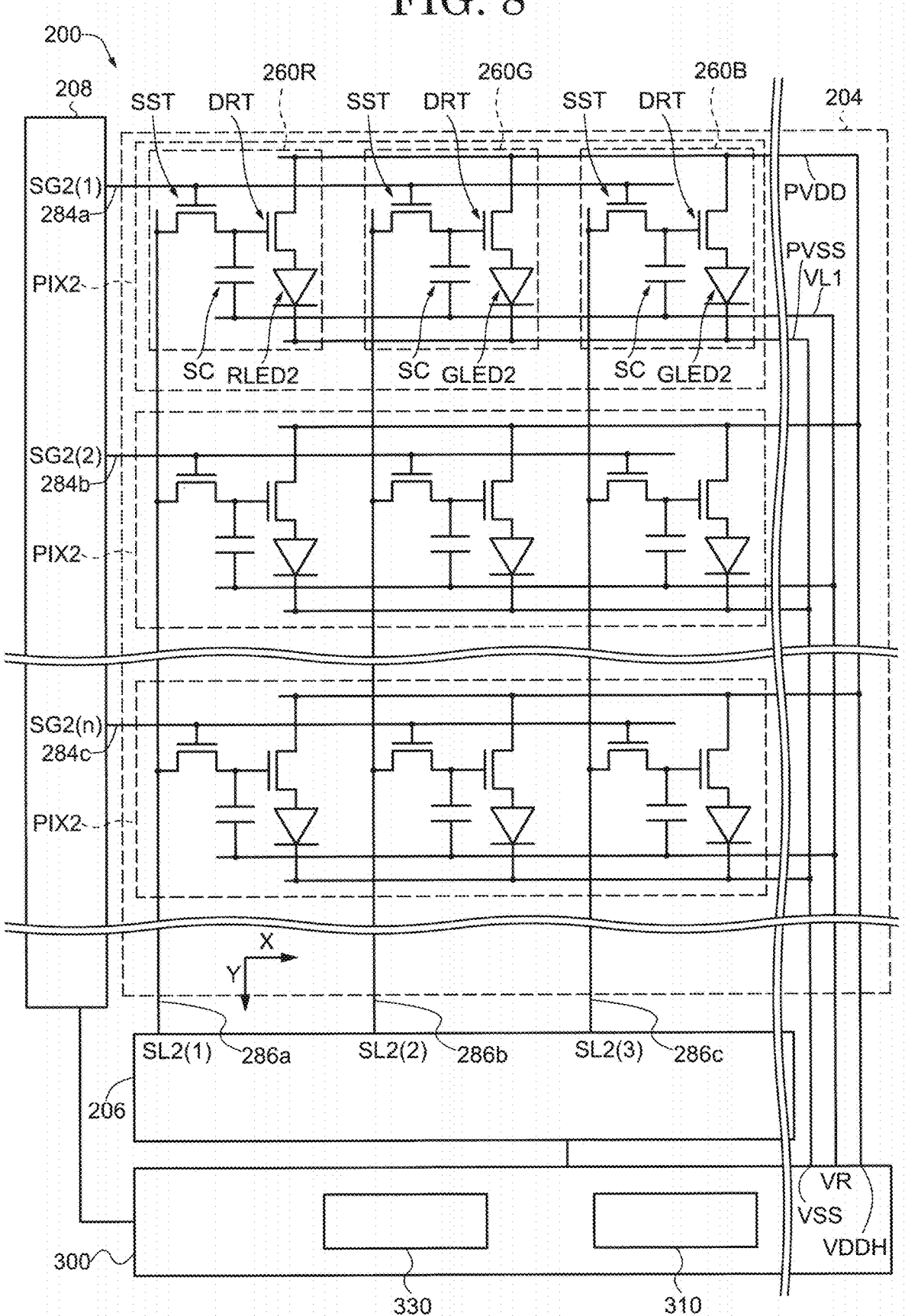
FIG. 8 is a schematic plan view showing configurations of the second display panel and the control device according to the first embodiment of the present invention.
Figure 9:
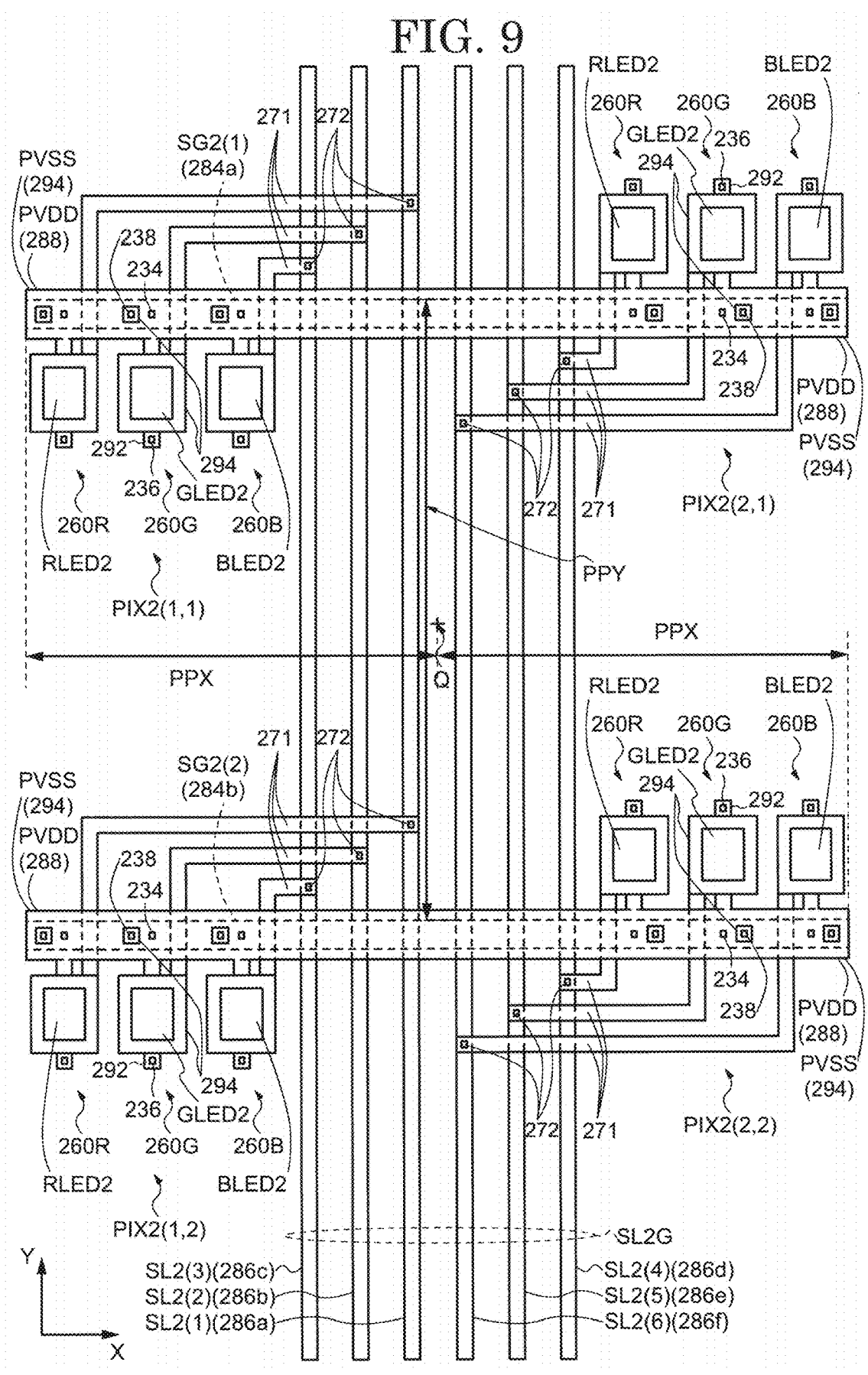
FIG. 9 is a schematic plan view showing configurations of a plurality of pixels and wirings included in the second display panel according to the first embodiment of the present invention.

FIG. 7 and FIG. 8 are schematic plan views showing the configurations of the second display panel 200 and the control device 300. FIG. 9 is a schematic plan view showing a configuration of the plurality of pixels PIX2 and wirings (video signal lines 286a to 286f) included in the second display panel 200. Descriptions of the same or similar configurations as those in FIG. 1 to FIG. 6 will be omitted.

First, block configurations of the second display panel 200 and the control device 300 will be described with reference to FIG. 7. As shown in FIG. 7, the second display panel 200 is roughly divided into the display unit 204 and a peripheral portion 216. The second display panel 200 includes the substrate 210, the second driver IC 206, the scanning signal line driving circuit 208, the FPC 250, the plurality of pixels PIX2, a wiring 224, and a wiring 226.

As described above, the display unit 204 includes the plurality of pixels PIX2. The peripheral portion 216 includes the second driver IC 206, the scanning signal line driving circuit 208, a terminal portion 209, the FPC 250, and a plurality of wirings 224. The display unit 204 and the peripheral portion 216 include a plurality of wirings 226. The terminal portion 209 includes a plurality of terminals 215 and a plurality of terminals 218. The scanning signal line driving circuit 208, the plurality of terminals 215, the plurality of terminals 218, and the plurality of pixels PIX2 are arranged on the second surface 214 (see FIG. 2) of the substrate 210. The second driver IC 206 is arranged on the upper surface of the FPC 250.

The plurality of pixels PIX2 is arranged in a matrix in the direction X and the direction Y. Each of the plurality of pixels PIX2 includes a plurality of sub-pixels 260R, 260G, and 260B. For example, the sub-pixel 260R has a light-emitting element RLED2 that emits red light, the sub-pixel 260G has a light-emitting element GLED2 that emits green light, and the sub-pixel 260B has a light-emitting element BLED2 that emits blue light. In the display device 10, each of the light-emitting elements RLED2, GLED2, and BLED2 may be referred to as the LED chip.

The scanning signal line driving circuit 208 and the second driver IC 206 are electrically connected to the control device 300. The scanning signal line driving circuit 208 and the second driver IC 206 use the signal and the power source voltage supplied from the control device 300 to drive the transistor (see FIG. 5) included in the respective pixel PIX2, and for example, to cause the light-emitting element RLED2 to emit light or not to emit light. As a result, the second display panel 200 can display an image on the display unit 204.

Since the configurations and functions of the substrate 210 including the display unit 204, the peripheral portion 216, the first surface 212, and the second surface 214 of the second display panel 200, the second driver IC 206, the scanning signal line driving circuit 208, the terminal portion 209, the FPC 250, the pixel PIX2, the wiring 224, the wiring 226, the terminal 215, the sub-pixel 260R, the sub-pixel 260G, the sub-pixel 260B, the light-emitting element BLED2, the light-emitting element BLED2 of the first display panel 200 are the same as the configurations and functions of the substrate 110 including the display unit 104, the peripheral portion 116, the first surface 112, and the second surface 114, the first driver IC 106, the scanning signal line driving circuit 108, the terminal portion 111, the FPC 150, the pixel PIX1, the wiring 124, the wiring 126, the terminal 115, the terminal 118, the sub-pixel 160R, the sub-pixel 160G, the sub-pixel 160B, the light-emitting element RLED1, the light-emitting element GLED1, and the light-emitting element BLED1 described with reference to FIG. 4 to FIG. 6, respectively, detailed descriptions herein will be omitted.

In addition, the video signal lines 286a to 286f (video signals SL2 (1) to SL2 (6), SL2 (m)), scanning signal lines 284a to 284c (scanning signals SG2 (1) to SG2 (3), SG2 (n)), a pixel circuit of the pixel PIX2, an example of the drive of the pixel circuit, and a configuration example of the pixel PIX2 (a video signal line group SL2G, a semiconductor layer 271, a contact hole 234, a contact hole 238, a fifth conductive layer 294, a fourth conductive layer 292, and the like) of the second display panel 200 are the same as the configurations and functions of the video signal lines 186a to 186f (the video signals SL2 (1) to SL1 (6), SL1 (m)), the scanning signal lines 184a to 184c (the scanning signals SG2 (1) to SG1 (3) SG1 (n)), the pixel circuit of the pixel PIX1, an example of the drive of the pixel circuit, the configuration example of the pixel PIX1 (the image signal line group SL1G, the semiconductor layer 171, the contact hole 134, the contact hole 138, the fifth conductive layer 194, the contact hole 136, and the fourth conductive layer 192), detailed descriptions herein will be omitted.

[7. Configuration Example of Display Device 10]

Figure 10:
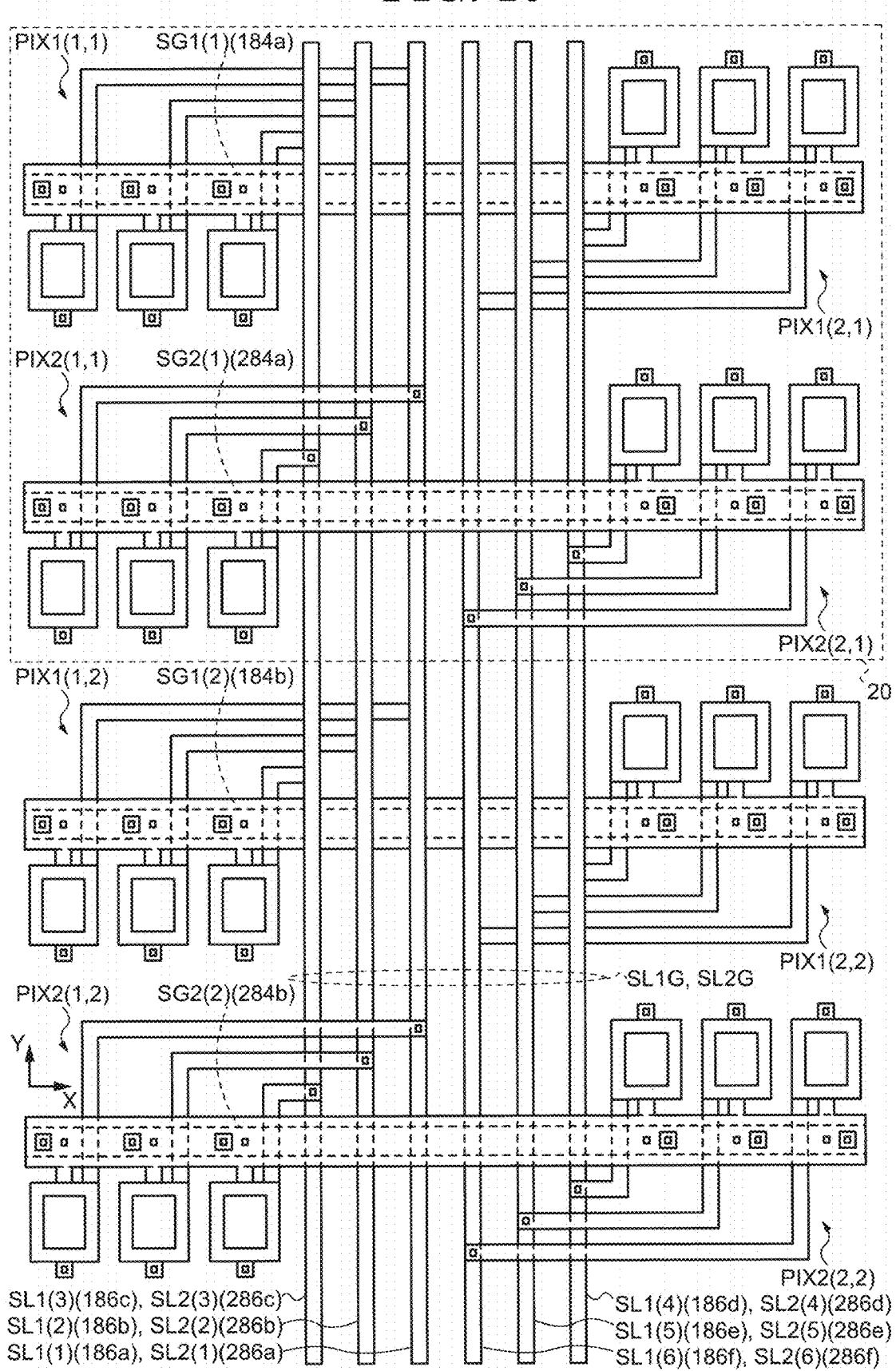
FIG. 10 is a schematic plan view showing configurations of a plurality of pixels and wirings included in the display device according to the first embodiment of the present invention.
Figure 11:
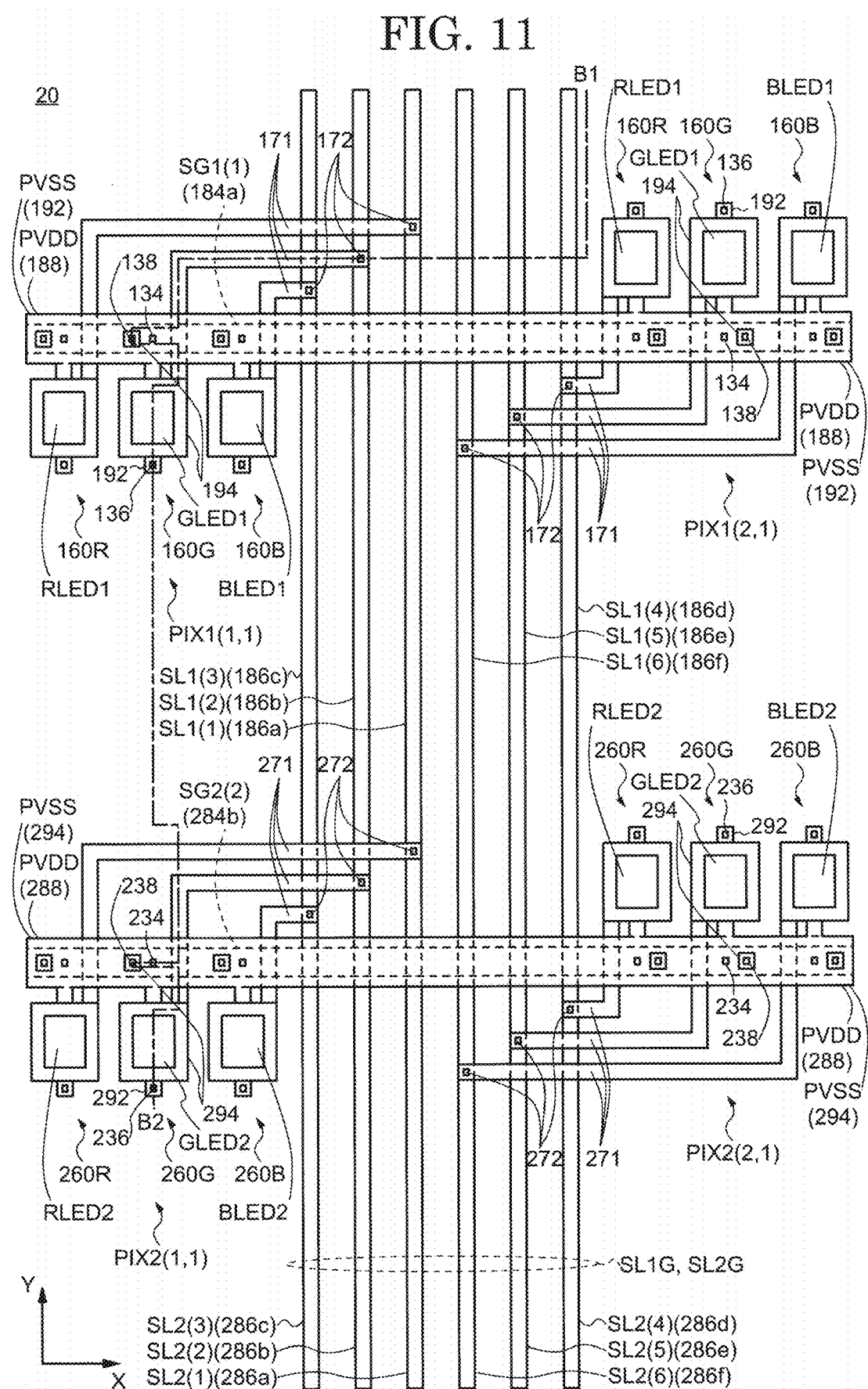
FIG. 11 is an enlarged view of a portion of the plurality of pixels and wirings shown in FIG. 10.
Figure 12:
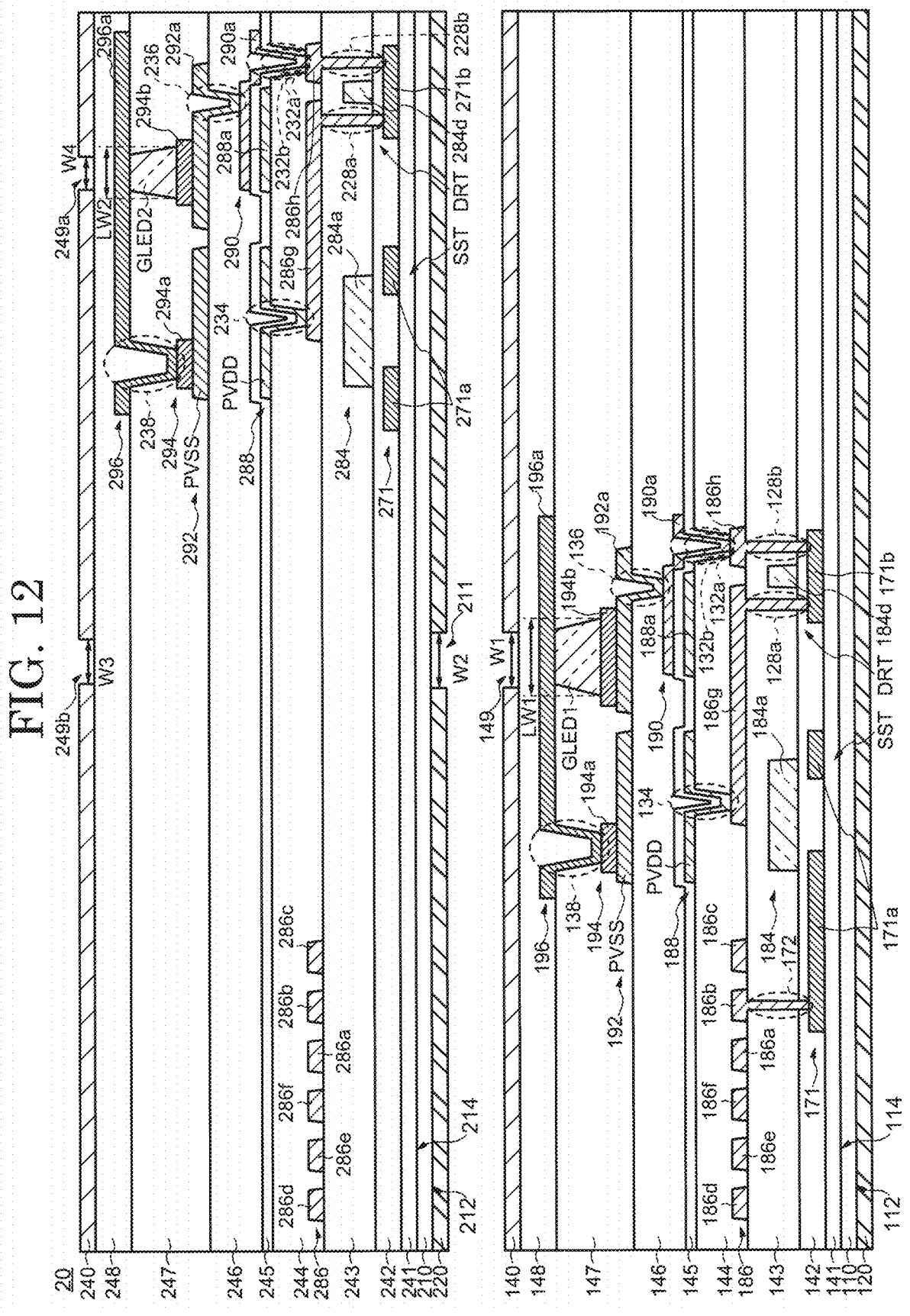
FIG. 12 is a cross-sectional view showing a cut surface along a line B1-B2 shown in FIG. 11.

FIG. 10 is a schematic plan view showing a configuration of the plurality of pixels PIX1, pixels PIX2, and wirings (the video signal lines 186a to 186f, the video signal lines 286a to 286f, the scanning signal lines 184a to 184b, and the scanning signal lines 284a to 284b) included in the display device 10. In addition, FIG. 10 is an enlarged view of part of the display unit 104 and the display unit 204 in which parts other than the plurality of pixels PIX1, pixels PIX2, and wirings (the video signal lines 186a to 186f, the video signal lines 286a to 286f, the scanning signal lines 184a to 184b, the scanning signal lines 284a to 284b, and the like) included in the display unit 10 are omitted for clarity. FIG. 11 is an enlarged view of part of the plurality of pixels PIX1, pixels PIX2, and wirings shown in FIG. 10. FIG. 12 is a cross-sectional view showing a cut surface along a line B1-B2 shown in FIG. 11. Descriptions of the same or similar configurations as those in FIG. 1 to FIG. 9 will be omitted.

First, a configuration example of the display device 10 in a plan view will be described with reference to FIG. 10 or FIG. 11. In a plan view of the display device 10, the pixel PIX1 of the first display panel 100 and the pixel PIX2 of the second display panel 200 are alternately arranged in the direction Y. Specifically, the pixel PIX1 (1, 1) and the pixel PIX1 (2, 1) arranged in the direction X, a pixel PIX2 (1, 1) and a pixel PIX2 (2, 1) arranged in the direction X, a pixel PIX1 (1, 2) and a pixel PIX1 (2, 2) arranged in the direction X, a pixel PIX2 (1, 2) and a pixel PIX2 (2, 2) arranged in the direction X are arranged in the direction Y in this order.

The scanning signal line of the first display panel 100 and the scanning signal line of the second display panel 200 are alternately arranged in the direction Y. Specifically, in a plan view of the display device 10, the scanning signal line 184a, the scanning signal line 284a, the scanning signal line 184b, and the scanning signal line 284b are arranged in the direction Y in this order.

The video signal lines 186a to 186f of the first display panel 100 overlap the video signal lines 286a to 286f of the second display panel 200. That is, the video signal line group SL1G overlaps the video signal line group SL2G. Specifically, the video signal line 186a overlaps the video signal line 286a, the video signal line 186b overlaps the video signal line 286b, the video signal line 186c overlaps the video signal line 286c, the video signal line 186d overlaps the video signal line 286d, the video signal line 186f overlaps the video signal line 286f.

In the display device 10, the pixel PIX2 and the pixel PIX2 are arranged so as to be shifted without overlapping, and the video signal lines of the first display panel 100 and the second display panel 200 are arranged so as to overlap each other, so that the light emission path of the light-emitting element included in the pixel PIX1 and the pixel PIX2 can be secured. In addition, the display device 10 has a higher density of the light-emitting element and a higher definition of the display device as compared with the case where either the second display panel 200 or the first display panel 100 is included.

In addition, as will be described later, an opening is arranged in the insulating layer 140, the low reflection heat dissipation layer 220, and the insulating layer 240 at a portion where the light-emitting element RELD2, the light-emitting element GLED2, the light-emitting element BLED2, the low reflection heat dissipation layer 220, and the insulating layer 240 of the pixel PIX2 overlap. As a result, the light-emitting element RLED2, the light-emitting element GLED2, and the light-emitting element BLED2 of the pixel PIX2 can emit light toward the observer 30 (FIG. 3) side.

Next, a cut surface of the display device 10 will be described with reference to FIG. 12. As described above, although FIG. 12 is a cross-sectional view showing the cut surface along the line B1-B2 shown in FIG. 11, FIG. 12 is a schematic view of a cut surface including the part omitted in FIG. 10 and FIG. 11. As described above, in the display device 10, the second display panel 200 overlaps the first display panel 100.

First, a cross-sectional structure of the first display panel 100 will be described. The low reflective heat dissipation layer 120 is arranged on the first surface 112 of the substrate 110. The low reflection heat dissipation layer 120 has a high thermal conductivity, and the low reflection heat dissipation layer 120 has a reflectance of 10% or less in the wavelength range of visible light. For example, the low reflection heat dissipation layer 120 may be an antireflection film or a highly diffracted film, and may be a black resin film containing carbon or the like.

The low reflection heat dissipation layer 120 may have a two-layer structure of a heat dissipation layer and a low-reflection layer. In addition, the low reflection heat dissipation layer 120 may be a substrate (low-reflection heat dissipation substrate) having high thermal conductivity and low reflectance. In the case where the low reflection heat dissipation layer 120 is a low reflection heat dissipation substrate, the low reflection heat dissipation substrate is a substrate different from the substrate 110, and the low reflection heat dissipation substrate is attached to the substrate 110 using a viscous material such as a conductive adhesive.

The semiconductor layer 171 is arranged on the second side 114 of the substrate 110 via a base layer 141 in any configuration. The semiconductor layer 171 includes a semiconductor film 171a, and a semiconductor film 171b. Agate wiring layer 184 is arranged above an insulating layer 142. That is, the insulating layer 142 is arranged above the semiconductor layer 171 and between the gate wiring layer 184 and the semiconductor layer 171. The gate wiring layer 184 includes the scanning signal line 184a and a gate electrode 184d. An insulating layer 143 is arranged above the gate wiring layer 184. A first conductive layer 186 is arranged above the insulating layer 143. The first conductive layer 186 includes the video signal lines 186a to 186f, a source electrode 186g, and a drain electrode 186h.

The select transistor SST and the drive transistor DRT are arranged on the second surface 114. The select transistor SST includes the semiconductor film 171a, part of the insulating layer 142, part of the scanning signal line 184a, and part of the video signal line 186b. Part of the insulating layer 142 functions as a gate insulating layer of the select transistor SST, part of the scanning signal line 184a functions as a gate electrode of the select transistor SST, and part of the video signal line 186b functions as a source electrode of the select transistor SST. The drive transistor DRT includes the semiconductor film 171b, part of the insulating layer 142, the gate electrode 184d, the source electrode 186g, and the drain electrode 186h. Part of the insulating layer 142 functions as a gate insulating film of the drive transistor DRT.

Part of the scanning signal line 184a (the gate electrode of the select transistor SST) overlaps the semiconductor film 171a, and the gate electrode 184d overlaps the semiconductor film 171b. An area where the semiconductor film overlaps the gate electrode is the channel area of each transistor. Each semiconductor film may have a source area and a drain area so as to sandwich the channel area. The source area or the drain area may form a source electrode or a drain electrode. The source electrode or the drain electrode may be formed by implanting an impurity into the semiconductor layer 171.

The video signal line 186b is electrically connected to the semiconductor film 171a via the contact hole 172 in which part of the insulating layer 143 and the insulating layer 142 is exposed. The source electrode 186g and the drain electrode 186h are electrically connected to the semiconductor film 171b via a contact hole 128a and a contact hole 128b in which part of the insulating layer 143 and the insulating layer 142 is exposed. Although not shown, the scanning signal line 184a or the gate electrode 184d is electrically connected to the electrode or wiring included in the first conductive layer 186 via the contact hole in which part of the insulating layer 143 is exposed.

An insulating layer 144, a second conductive layer 188, an insulating layer 145, and a third conductive layer 190 are arranged on the first conductive layer 186 in this order. The insulating layer 144 includes the contact hole 134 and a contact hole 132a exposing part of the first conductive layer 186. The second conductive layer 188 includes the drive power supply line PVDD and an electrode 188a. The insulating layer 145 includes a contact hole 132b exposing part of the first conductive layer 186. The third conductive layer 190 includes an electrode 190a. The drive power supply line PVDD is electrically connected to the source electrode 186g via the contact hole 134. The third conductive layer 190 is electrically connected to the drain electrode 186h via the contact hole 132b and the contact hole 132a. In addition, the electrode 188a or the electrode 190a may be a wiring.

An insulating layer 146 is arranged on the insulating layer 145 and the third conductive layer 190. The fourth conductive layer 192 and the fifth conductive layer 194 are arranged on the insulating layer 146 in this order. The insulating layer 146 includes the contact hole 136 exposing part of the third conductive layer 190. The fourth conductive layer 192 includes the reference potential line PVSS and an electrode 192a. The fifth conductive layer 194 includes the junction electrode 194a and a junction electrode 194b. The electrode 192a is electrically connected to the electrode 190a via the contact hole 136. The junction electrode 194a is electrically connected to the reference potential line PVSS, and the junction electrode 194b is electrically connected to the electrode 192a. In addition, the electrode 192a, the junction electrode 194a, or the junction electrode 194b may be a wiring.

The light-emitting element GLED1 is electrically connected to the junction electrode 194b. In the first display panel 100, the junction electrode 194b is an anode electrode.

An insulating layer 147 is arranged such that the light-emitting element GLED1 is embedded in the insulating layer 147 above the light-emitting element GLED1, the insulating layer 146, the fourth conductive layer 192, and the fifth conductive layer 194. A sixth conductive layer 196 is arranged on the insulating layer 147. The insulating layer 147 includes the contact hole 138 in which part of the fifth conductive layer 194 is exposed. The sixth conductive layer 196 includes an electrode 196a. The electrode 196a is electrically connected to the junction electrode 194a via the contact hole 138. The electrode 196a is electrically connected to the reference potential line PVSS via the junction electrode 194a. In the first display panel 100, the electrode 196a is a cathode electrode.

An insulating layer 148 is arranged between the insulating layer 140 and the insulating layer 147, which function as the low reflection heat dissipation layer, is in contact with the insulating layer 147, and covers the sixth conductive layer 196.

The insulating layer 140 is arranged above the insulating layer 147. For example, the insulating layer 140 has a function of covering the wiring or the electrode. The insulating layer 140 includes an opening 149 so that the light emitted by the light-emitting element passes through to the observer side. For example, a diameter of the opening 149 is a length W1, and a width of the light-emitting element GLED1 is a width LW1. In the first display panel 100, the length W1 is smaller than the width LW1, which can block part of the light emitted by the light-emitting element GLED1 and reduce the amount of light. In addition, the insulating layer 140 may be formed using the same material as the low reflection heat dissipation layer 120, and may have the same configuration and function. That is, the insulating layer 140 may be the heat dissipation layer (the third heat dissipation layer).

For example, a metal such as aluminum (Al), titanium (Ti), molybdenum (Mo), copper (Cu), or tungsten (W), or an alloy thereof can be used as the material of the gate wiring layer 184 and the first conductive layer 186. In addition, the gate wiring layer 184 and the first conductive layer 186 may be single layers or stacked layers.

For example, a transparent conductive material such as indium tin oxide (ITO) or indium zinc oxide (IZO) can be used as the material of the second conductive layer 188.

The third conductive layer 190 may function as a wiring layer for connecting the first conductive layer 186 and the fourth conductive layer 192. For example, a material similar to that of the gate wiring layer 184 and the first conductive layer 186 can be used as the material of the third conductive layer 190. In addition, the third conductive layer 190 may be a single layer or a stacked layer similar to the gate wiring layer 184 or the first conductive layer 186.

The fourth conductive layer 192 may function as an electrode pad for mounting the light-emitting element. In addition, the fourth conductive layer 192 may function as a reflective layer that reflects the light emitted from the light-emitting element. For example, a material similar to that of the gate wiring layer 184 and the first conductive layer 186 can be used as the material of the fourth conductive layer 192. In addition, the fourth conductive layer 192 may be a single layer or a stacked layer similar to the gate wiring layer 184 or the first conductive layer 186.

The fifth conductive layer 194 may function as a bonding layer for bonding the light-emitting element. For example, tin, silver-paste, solder, or an anisotropic conductive film (ACF) can be used as the material of the fifth conductive layer 194.

For example, the sixth conductive layer 196 may function as a cathode electrode of the light-emitting element BLED2 or a wiring layer for routing the cathode electrode. In addition, the sixth conductive layer 196 may function as a transmission layer that transmits the light emitted from the light-emitting element. For example, a transparent conductive material such as indium tin oxide (ITO) or indium zinc oxide (IZO) can be used as the material of the sixth conductive layer 196.

The insulating layer 142 may separate the semiconductor layer 171 from the gate wiring layer 184 so that the semiconductor layer 171 and the gate wiring layer 184 do not short-circuit. For example, an inorganic insulating material such as silicon oxide ($SiO_x$), silicon oxynitride ($SiO_xN_y$), silicon nitride ($SiN_x$), or silicon nitride oxide ($SiN_xO_y$) may be used as the material of the insulating layer 142. In this case, the $SiO_xN_y$ is a silicon compound that contains less nitrogen (N) than oxygen (O). The $SiN_xO_y$ is a silicon compound that contains less oxygen than nitrogen.

The insulating layer 143 is arranged on uneven sections caused by the transistor and other semiconductor devices and has a function of forming a flat surface. An organic compound material selected from acrylics, polyimides, and the like, which has excellent flat film properties, can be used as a material of the insulating layer 143.

The insulating layer 145 may separate the second conductive layer 188 and the third conductive layer 190 from each other so that the second conductive layer 188 and the third conductive layer 190 do not short-circuit. For example, an inorganic insulating material such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), or aluminum nitride ($AlN_x$) can be used as a material of the insulating layer 145. In this case, the $AlO_xN_y$ is an aluminum compound that contains less nitrogen (N) than oxygen (O). The $AlN_xO_y$ is an aluminum compound that contains less oxygen than nitrogen. In addition, not only an inorganic insulating material but also an organic insulating material can be used for the insulating layer 145. For example, a polyimide resin, an acryl resin, an epoxy resin, a silicone resin, a fluororesin, or a siloxane resin can be used as the organic insulating material. In the insulating layer 145, the inorganic insulating layer material and the organic insulating material may be used alone or may be stacked.

The insulating layer 144, the insulating layer 146, and the insulating layer 148 are arranged on the uneven sections of the layers below and have the function of forming a flat surface. In addition, the insulating layer 144 has a function of separating the video signal lines 186a to 186f from each other and separating the video signal lines 186a to 186f from other conductive layers. For example, an organic resin such as a polyimide resin, an acryl resin, an epoxy resin, a silicone resin, a fluororesin, or a siloxane resin can be used as the insulating layer 144, the insulating layer 146, and the insulating layer 148. In the insulating layer 144, the insulating layer 146, or the insulating layer 148, an organic resin may be used alone or may be stacked. In addition, the insulating layer 148 may be an insulating adhesive for bonding the insulating layer 140 to the insulating layer 147 and the sixth conductive layer 196. Furthermore, similar to the low reflection heat dissipation layer 120, the insulating layer 140 and the insulating layer 148 may have a two-layer structure of a heat dissipation layer and a low-reflection layer.

For forming the sixth conductive layer, the insulating layer 147 has a function of reducing a step such as the light-emitting element under the sixth conductive layer and forming a flat surface. For example, a photosensitive organic material such as photosensitive acryl or photosensitive polyimide can be used as a material of the insulating layer 147.

Next, a cross-sectional structure of the second display panel 200 will be described. In the description of the cross-sectional structure of the second display panel 200, the description of the same or similar configuration and function as the cross-sectional structure of the first display panel 100 is omitted, and the difference from the cross-sectional structure of the first display panel 100 will be mainly described.

In the second display panel 200, the substrate 210, a base layer 241, the semiconductor layer 271, a gate wiring layer 284, an insulating layer 243, a first conductive layer 286, an insulating layer 244, a second conductive layer 288, an insulating layer 245, a third conductive layer 290, an insulating layer 246, the fourth conductive layer 292, the fifth conductive layer 294, and an insulating layer 247 are stacked in this order.

Since the configurations of the second display panel 200 including the substrate 210 including the first surface 212 and the second surface 214, the semiconductor layer 271, the base layer 241, a semiconductor film 271a, the semiconductor film 271b, the gate wiring layer 284, an insulating layer 242, the scanning signal line 284a, a gate electrode 284d, the first conductive layer 286, the video signal lines 286a to 286f, a source electrode 286g, a drain electrode 286h, the select transistor SST, and the drive transistor DRT, and the configurations and functions of the insulating layer 244, the second conductive layer 288, the insulating layer 245, the third conductive layer 290, a contact hole 232a, the drive power supply line PVDD, an electrode 288a, a contact hole 232b, the contact hole 172, the insulating layer 246, the fourth conductive layer 292, the fifth conductive layer 294, a contact hole 236, the reference potential line PVSS, an electrode 292a, an electrode 294a, an electrode 294b, the insulating layer 247, and the contact hole 238 are the same as the configurations of the first display panel including the substrate 110 including the first surface 112 and the second surface 114 described using FIG. 12, the semiconductor layer 171, the base layer 141, the semiconductor film 171a, the gate wiring layer 184, the insulating layer 142, the scanning signal line 184a, the gate electrode 184d, the insulating layer 143, the first conductive layer 186, the video signal lines 186a to 186f, the source electrode 186g, the drain electrode 186h, the select transistor SST, and the drive transistor DRT, and the configurations and functions of the insulating layer 144, the second conductive layer 188, the insulating layer 145, the third conductive layer 190, the contact hole 134, the contact hole 132a, the drive power supply line PVDD, the electrode 188a, the contact hole 132b, the electrode 190a, the contact hole 172, the insulating layer 146, the fourth conductive layer 192, the fifth conductive layer 194, the contact hole 136, the reference potential line PVSS, the electrode 192a, the junction electrode 194a, the junction electrode 194b, the insulating layer 147, and the contact hole 138 and the like, detailed descriptions herein will be omitted.

In the second display panel 200, the low reflection heat dissipation layer 220 is arranged on the first surface 212 of the substrate 210, the light-emitting element GLED2 is electrically connected to the electrode 294b, and the insulating layer 240 is arranged above the insulating layer 247. The electrode 294b is an anode electrode.

The low reflection heat dissipation layer 220 includes an opening 211. The opening 211 is arranged in the low reflection heat dissipation layer 220 so as to overlap the opening 149 and the light-emitting element GLED1 of the first display panel 100. A diameter of the opening 211 is a length W2. The length W2 is smaller than the length W1 and the width LW1, which can block part of the light emitted by the light-emitting element GLED1 and reduce the amount of light. In the display device 10, the low reflection heat dissipation layer 220 is arranged so as to overlap the entire surface of the first surface 212 except for the opening 211. Since the configuration and function of the low reflection heat dissipation layer 220 other than those described above are the same as those of the low reflection heat dissipation layer 120, detailed descriptions herein will be omitted.

For example, the insulating layer 240 has a function of covering the wiring or the electrode. In addition, the insulating layer 240 includes an opening 249b so that the light emitted by the light-emitting element GLED1 or the light emitted by the light-emitting element passes through to the observer side, and includes an opening 249a so that the light emitted by the light-emitting element GLED2 passes through to the observer side.

The opening 249b is arranged in the insulating layer 240 so as to overlap the opening 149 and the light-emitting element GLED1 of the first display panel 100 and the opening 211. The opening 249a is arranged in the insulating layer 240 so as to overlap the light-emitting element GLED2.

For example, a diameter of the opening 249b is a length W3, a diameter of the opening 249a is a length W4, and a width of the light-emitting element GLED2 is a width LW2. In the second display panel 200, the length W3 is smaller than the width LW1, the length W1, and the length W2, which can block part of the light emitted by the light-emitting element GLED1 and reduce the amount of light. In addition, the length W4 is smaller than the width LW2, which can block part of the light emitted by the light-emitting element GLED2 and reduce the amount of light. Other configurations and functions of the insulating layer 240 may be similar to those of the low reflection heat dissipation layer 120. That is, the insulating layer 240 may be a heat dissipation layer (the fourth heat dissipation layer) or may be a low reflection heat dissipation layer.

In the display device 10, a distance between the first display panel 100 and the observer 30 is longer than a distance between the second display panel 200 and the observer 30. In the display device 10, the size of the light-emitting element arranged in the first display panel 100 (for example, the width LW1 of the light-emitting element RLED1) is smaller than the size of the light-emitting element arranged in the second display panel 200 (for example, the width LW2 of the light-emitting element RLED2). In general, the larger the size of the light-emitting element, the better the luminous efficacy. Therefore, increasing the size of the light-emitting element at a position far from the observer 30 makes it possible to make the equivalent light from the light-emitting element reach the observer 30 without depending on the distance between the observer 30 and the light-emitting element.

An insulating layer 248 is arranged between the insulating layer 240 and the insulating layer 247. Since the insulating layer 248 has the same configuration and function as the insulating layer 148, the detailed description of the insulating layer 248 is omitted, but the insulating layer 248 may be an insulating adhesive for bonding the insulating layer 240 to the insulating layer 247 and the sixth conductive layer 296.

[8. Example of Displaying Method of Display Device 10]

Figure 13:
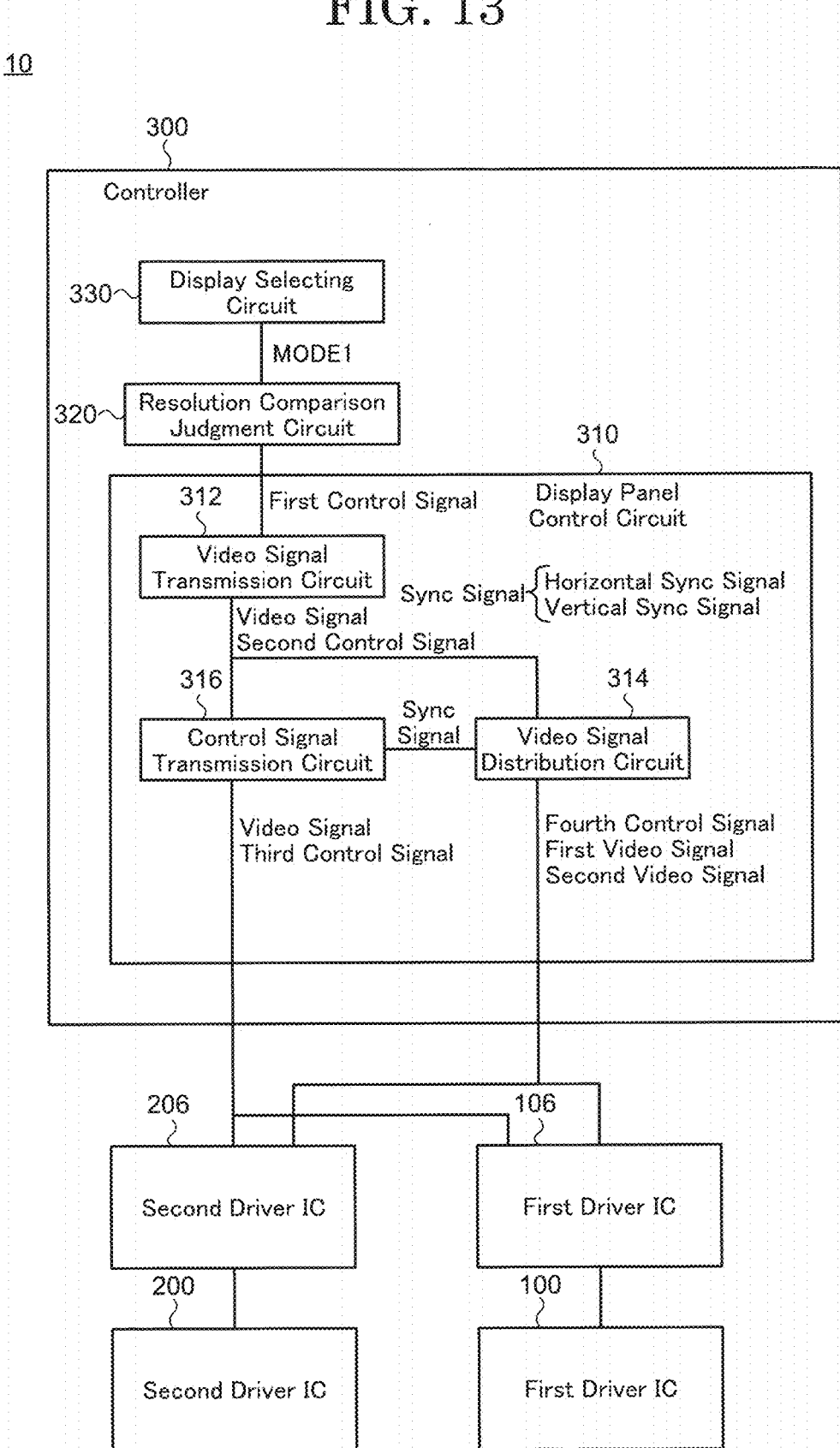
FIG. 13 is a functional block diagram showing the control device in the display device according to the first embodiment of the present invention.
Figure 14:
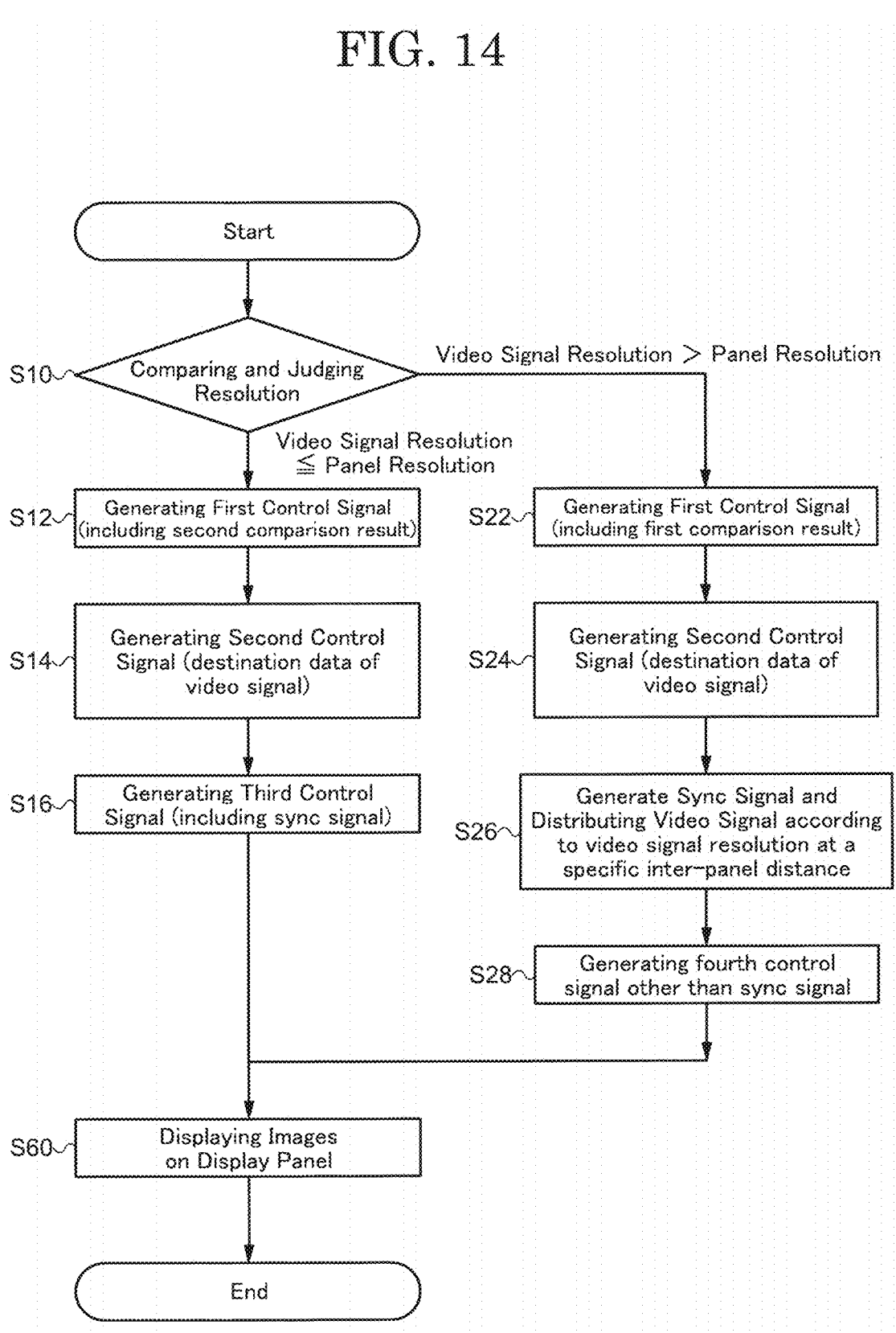
FIG. 14 is a flow chart for explaining a displaying method of the display device according to the first embodiment of the present invention.

FIG. 13 is a functional block diagram of the control device 300 in the display device 10. FIG. 14 is a flow chart for explaining a displaying method of the display device 10.

Figure 15:
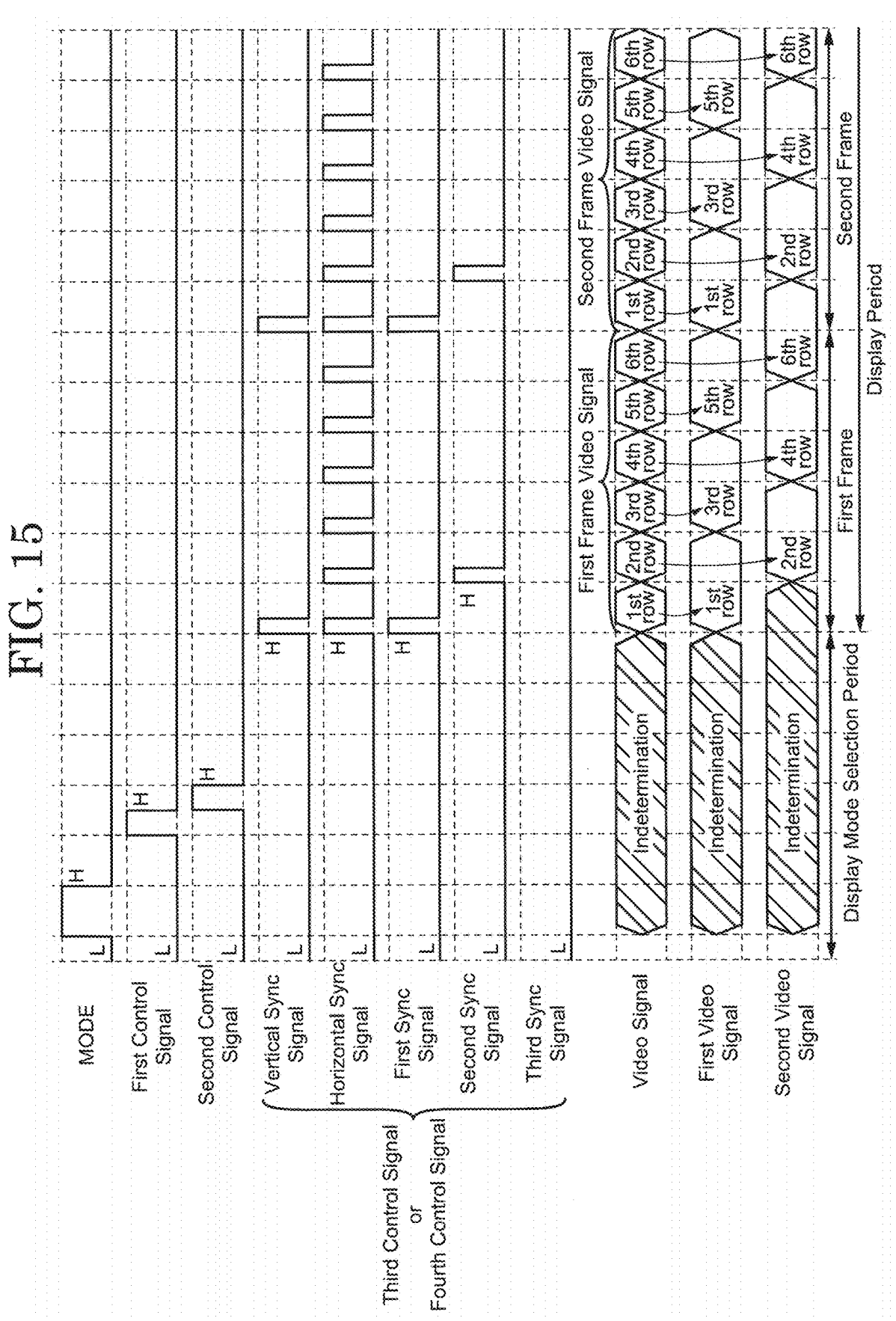
FIG. 15 is a timing chart for explaining a displaying method of the display device according to the first embodiment of the present invention.

FIG. 15 is a timing chart for explaining a displaying method of the display device 10. Descriptions of the same or similar configurations as those in FIG. 1 to FIG. 12 will be omitted.

The display device 10 includes two display panels (the first display panel 100 and the second display panel 200) as an example. It is possible to choose to use only the first display panel 100 or to use the first display panel 100 and the second display panel 200 according to the resolution to which the video signal corresponds by including the two display panels in the display device 10. That is, the resolution of the display device 10 can be changed according to the resolution of the video signal.

In addition, the display device 10 may include three or more display panels. In the case where the display device 10 includes three or more display panels, the display device 10 can be displayed with a higher definition according to the resolution to which the video signal corresponds.

An example of the displaying method (resolution change displaying method) for changing the resolution of the display device 10 will be described with reference to FIG. 13 to FIG. 15.

First, a functional block configuration of the display device 10 will be described with reference to FIG. 13. As described in "2. Configurations of First Display Panel 100 and Control Device 300", or "6. Configurations of Second Display Panel 200 and Control Device 300", and the like, the control device 300 is electrically connected to the first driver IC 106 and the second driver IC 206. In addition, the first driver IC 106 is electrically connected to the first display panel 100 and the second driver IC 206 is electrically connected to the second display panel 200.

As shown in FIG. 13, the control device 300 includes the display selection circuit 330 (FIG. 1), a resolution comparison judgement circuit 320, and the display panel control circuit 310. For example, the display panel control circuit 310 includes a video signal transmission circuit 312, a video signal distribution circuit 314, and a control signal transmission circuit 316.

The display selection circuit 330 has a function of selecting a displaying method of the display device 10. For example, in the case where the display device 10 includes a plurality of displaying methods, the user can select the resolution change displaying method from the plurality of displaying methods by an input function (not shown). The display selection circuit 330 may select a resolution change displaying method (MODE1) based on an input signal MODE transmitted from the input function, and the display device 10 can initiate the resolution change displaying method.

The resolution comparison judgement circuit 320 has a function of comparing and judging the resolution. Specifically, the resolution comparison judgement circuit 320 compares the resolution displayable by the second display panel 200 with the resolution to which the video signal corresponds. In addition, the resolution comparison judgement circuit 320 generates a comparison result, and transmits a first control signal to the video signal transmission circuit 312. The first control signal includes data of the comparison result. As will be described later, in the case where the resolution displayable by the second display panel 200 is smaller than the resolution to which the video signal corresponds, the resolution comparison judgement circuit 320 generates a first comparison result. In the case where the resolution displayable by the second display panel 200 is equal to or higher than the resolution to which the video signal corresponds, the resolution comparison judgement circuit 320 generates a second comparison result.

The video signal transmission circuit 312 has a function of determining a destination of the video signal. Specifically, the video signal transmission circuit 312 determines whether to transmit the video signal to the second display panel 200 or the video signal to the first display panel 100 and the second display panel 200 according to the first control signal, and transmits a second control signal and the video signal to the video signal distribution circuit 314 or the control signal transmission circuit 316. The second control signal includes data of a transmission destination of the video signal. As will be described later, in the case where the first control signal includes data of the second comparison result, the video signal transmission circuit 312 determines the destination of the video signal to be the second display panel 200 and transmits the second control signal and the video signal to the control signal transmission circuit 316. In the case where the first control signal includes the data of the first comparison result, the video signal transmission circuit 312 determines the destination of the video signal to be the first display panel 100 and the second display panel 200 and transmits the second control signal and the video signal to the video signal distribution circuit 314.

The control signal transmission circuit 316 has a function of generating and transmitting a signal for controlling the first driver IC 106 and the second driver IC 206 based on the second control signal and the video signal. Specifically, in the case where the video signal transmission circuit 312 determines the destination of the video signal to be the second display panel 200, the control signal transmission circuit 316 synchronizes the second display panel 200 and the first display panel 100 based on the second control signal and the video signal, generates a third control signal for supplying the video signal to the second display panel 200 and not driving the first display panel 100, and transmits the video signal and the third control signal to the second driver IC 206 and the first driver IC 106. In addition, in the case where the video signal transmission circuit 312 determines the destination of the video signal to be the first display panel 100 and the second display panel 200, the control signal transmission circuit 316 generates a synchronization signal for synchronizing the second display panel 200 and the first display panel 100 based on the second control signal and the video signal, and transmits the synchronization signal to the video signal distribution circuit 314.

The video signal distribution circuit 314 has a function of distributing the video signal to a first video signal for displaying on the first display panel 100 and a second video signal for displaying on the second display panel 200, based on the second control signal, the video signal, and the synchronization signal. In addition, the video signal distribution circuit 314 has a function of generating and transmitting a signal for controlling the second driver IC 206 and the first driver IC 106 based on the first video signal, the second video signal, and the synchronization signal. Specifically, in the case where the video signal transmission circuit 312 determines the destination of the video signal to be the first display panel 100 and the second display panel 200, the video signal distribution circuit 314 distributes the video signal to the first video signal and the second video signal according to the resolution to which the video signal corresponds at the current distance (distance H1) between the first display panel and the second display panel 200. For example, among the plurality of video signals, the video signal corresponding to the pixel PIX1 connected to the scanning signal line 184a is distributed to the first display panel 100 as the first video signal (the video signal SL1 (1)), and the video signal corresponding to the pixel PIX2 connected to the scanning signal line 284*a* is distributed to the second display panel 200 as the second video signal (the video signal SL2 (1)). In addition, the video signal distribution circuit 314 generates a fourth control signal other than the synchronization signal for supplying the first video signal and the second video signal to the first display panel 100 and the second display panel 200, based on the first video signal and the second video signal. Furthermore, the video signal distribution circuit 314 transmits the fourth control signal including the first video signal, the second video signal, and the synchronization signal to the second driver IC 206 and the first driver IC 106.

The third control signal and the fourth control signal include signals (synchronization signals) for synchronizing the driving of the first display panel 100 and the driving of the second display panel 200. For example, the synchronization signal includes a horizontal synchronization signal that controls the driving in a direction (direction X) parallel to the scanning signal line, and a vertical synchronization signal that controls the driving in a direction (direction Y) parallel to the video signal line. In addition, the third control signal includes a first synchronization signal and a third synchronization signal for synchronizing the driving timings of the second display panel 200 and the first display panel 100 to supply the video signal to the second display panel 200 and not to drive the first display panel 100. The fourth control signal includes the first synchronization signal and a second synchronization signal for synchronizing the driving timings of the second display panel 200 and the first display panel 100. The video signal distribution circuit 314 supplies the second video signal to the second display panel 200, and supplies the first video signal to the first display panel 100.

Next, a flow of the resolution change displaying method will be described with reference to FIG. 14.

For example, the resolution change displaying method (MODE1) of the display device 10 is selected based on the input signal MODE. The display device 10 starts driving for displaying the resolution change.

In step 10 (S10), the display device 10 compares and judges the resolution using the resolution comparison judgement circuit 320. For example, in the case where the resolution displayable by the second display panel 200 is equal to or higher than the resolution to which the video signal corresponds, the display device 10 executes step 12 (S12). In the case where the resolution displayable by the second display panel 200 is smaller than the corresponding resolution, the display device 10 executes step 22 (S22).

In step 12 (S12), the resolution comparison judgement circuit 320 generates the second comparison result and transmits the first control signal including the second comparison result to the video signal transmission circuit 312.

In step 14 (S14), the video signal transmission circuit 312 determines the destination of the video signal to be the second display panel 200 based on the first control signal including the second comparison result. In addition, the video signal transmission circuit 312 transmits the second control signal and the video signal to the control signal transmission circuit 316. The second control signal includes data which includes the destination of the video signal as the second display panel 200.

In step 16 (S16), the control signal transmission circuit 316 generates the third control signal based on the second control signal and the video signal. As described above, the third control signal includes the horizontal synchronization signal, the vertical synchronization signal, the first synchronization signal, and the third synchronization signal. The control signal transmission circuit 316 transmits the third control signal to the first driver IC 106 and the second driver IC 206, and transmits the video signal to the second driver IC 206.

In step 22 (S22), the resolution comparison judgement circuit 320 generates the second comparison result and transmits the first control signal including the second comparison result to the video signal transmission circuit 312.

In step 24 (S24), the video signal transmission circuit 312 determines the destination of the video signal to be the first display panel 100 and the second display panel 200 based on the first control signal including the first comparison result. In addition, the video signal transmission circuit 312 transmits the second control signal and the video signal to the video signal distribution circuit 314. The second control signal includes data which includes the destination of the video signal as the first display panel 100 and the second display panel 200.

In step 26 (S26), the control signal transmission circuit 316 generates the synchronization signal based on the second control signal and the video signal and transmits the synchronization signal to the video signal distribution circuit 314. Based on the synchronization signal, the second control signal, and the video signal, the video signal distribution circuit 314 distributes the video signal to the first video signal and the second video signal according to the resolution to which the video signal corresponds at the current distance (distance H1) between the first display panel and the second display panel 200.

In step 28 (S28), the video signal distribution circuit 314 generates the fourth control signal other than the synchronization signal based on the first video signal and the second video signal. The video signal distribution circuit 314 transmits the fourth control signal including the synchronization signal and the first video signal to the first driver IC 106 and transmits the fourth control signal including the synchronization signal and the second video signal to the second driver IC 206.

In step 60 (S60) following step 16 (S16) and step 28 (S28), the first driver IC 106 and the second driver IC 206 control the first display panel 100 and the second display panel 200 based on the signals received by the first driver IC 106 and the second driver IC 206, and the first display panel 100 or the second display panel 200 displays a picture.

Next, a timing chart of the resolution change displaying method will be described with reference to FIG. 15. The resolution change displaying method of the display device 10 includes a displaying method selection period and a display period. In the example of the resolution change displaying method of the display device 10, one frame of video is composed of the video signal corresponding to six rows of scanning signal lines.

In the displaying method selection period, the resolution change displaying method (MODE1) is selected based on a pulse of the input signal MODE. The display device 10 starts driving for displaying the resolution change. A pulse of the first control signal is generated based on the pulse of the input signal MODE. A pulse of the second control signal is generated based on the pulse of the first control signal.

The display device 10 memorizes the resolution at which the first display panel 100 can display, the resolution at which the second display panel 200 can display, and the resolution to which the video signals are stored in the display panel. In addition, the pulse in the display device 10 is, for example, a pulse that changes from the L level to the H level.

In the case where the first control signal includes the second comparison result (the resolution at which the second display panel 200 can display is equal to or higher than the resolution to which the video signal corresponds) in the display period, the picture is displayed on the second display panel 200, and the picture is not displayed on the first display panel 100.

In the case where the first control signal includes the second comparison result, the third control signal (the vertical synchronization signal, the horizontal synchronization signal, the first synchronization signal, and the third synchronization signal) is generated based on the pulse of the second control signal. The first synchronization signal is transmitted to the second display panel 200 and the third synchronization signal (constantly L-level signal) is transmitted to the first display panel 100. The third synchronization signal is constantly at the L level, the first display panel 100 is not driven, and no picture is displayed on the first display panel 100.

The first display panel 100 can be displayable based on the pulse of the first synchronization signal, and a video signal SL2 (*n*) corresponding to the first row (the scanning signal SG2 (1)) of the video signal of the first frame is transmitted to the second display panel 200 and displayed based on the first pulse of the vertical synchronization signal and the first pulse of the horizontal synchronization signal. Similarly, the video signal SL2 (*n*) corresponding to the second to sixth rows of the video signal of the first frame is transmitted to the second display panel 200, and the picture of the first frame is displayed. Timing charts after the second frame are the same as those of the first frame, and the description thereof will be omitted.

As described above, in the case where the resolution displayable by the second display panel 200 is equal to or higher than the resolution to which the video signal corresponds, the second display panel 200 displays the picture and the first display panel 100 does not display the picture. That is, the picture in the display device 10 can be displayed using only the second display panel 200 closer to the observer 30 (see FIG. 3) according to the resolution displayable by the second display panel 200 and the resolution to which the video signal corresponds.

In addition, in the case where the first control signal includes the first comparison result (the resolution displayable by the second display panel 200 is smaller than the resolution to which the video signal corresponds), the picture is displayed on both the second display panel 200 and the first display panel 100 according to the resolution to which the video signal corresponds at the current distance (distance H1) between the current first display panel and the second display panel 200, in the display period.

In the case where the first control signal includes the first comparison result, the fourth control signal (the vertical synchronization signal, the horizontal synchronization signal, the first synchronization signal, and the second synchronization signal) is generated based on the pulse of the second control signal. Since the scanning signal line SG1 (*n*) of the first display panel 100 and the scanning signal line SG2 (*n*) of the second display panel 200 are alternately arranged in the direction Y in the display device 10, for example, the video signal is distributed row-by-row based on the vertical synchronization signal, the horizontal synchronization signal, and the video signal.

For example, the video signal SL1 (*n*) corresponding to each of the first row (the scanning signal SG1 (1)), the third row (the scanning signal SG1 (2)), and the fifth row (the scanning signal SG1 (3)) of the video signal of the first frame is distributed to the first video signal based on the first pulse of the vertical synchronization signal, the first pulse, the third pulse, and the fifth pulse of the horizontal synchronization signal. In addition, for example, the video signal SL2 (*n*) corresponding to each of the second row (the scanning signal SG2 (1)), the fourth row (the scanning signal SG2 (2)), and the sixth row (the scanning signal SG2 (3)) of the video signal of the first frame is distributed to the second video signal based on the first pulse of the vertical synchronization signal, the second pulse, the fourth pulse, and the sixth pulse of the horizontal synchronization signal.

The first synchronization signal and the first video signal are transmitted to the first display panel 100, and the second synchronization signal and the second video signal are transmitted to the second display panel 200. The first display panel 100 can be displayable based on the pulse of the first synchronization signal, and the first display panel 100 can display the picture based on the first video signal. In addition, the second display panel 200 can be displayable based on the pulse of the second synchronization signal, and the second display panel 200 can display the picture based on the second video signal. The timing charts after the second frame are the same as those of the first frame, and the description thereof will be omitted.

As described above, in the case where the resolution displayable by the second display panel 200 is smaller than the resolution to which the video signal corresponds, both the second display panel 200 and the first display panel 100 can display the picture at the current distance (distance H1) between the first display panel and the second display panel 200 according to the resolution to which the video signal corresponds. That is, an image (picture) is displayed on both the second display panel 200 and the first display panel 100 according to the resolution displayable by the second display panel 200 and the resolution to which the video signal corresponds in the display device 10, whereby the density of the light-emitting element is high and a high-definition image can be realized.

In addition, as described above, it is possible to select to display an image (picture) only on the second display panel 200 or to display an image (picture) on the second display panel 200 and the first display panel 100 according to the resolution displayable by the second display panel 200 and the resolution to which the video signal corresponds in the display device 10. That is, the number of panels for displaying an image can be changed according to the resolution displayable by the second display panel 200 and the resolution to which the video signal corresponds in the display device 10. As a result, the density of the light-emitting element of the display device and the definition of the display device can be changed according to the resolution displayable by the second display panel 200 and the resolution to which the video signal corresponds, in the display device 10.

[9. Modification of Low Reflective Heat Dissipation Layer 220]

Figure 16:
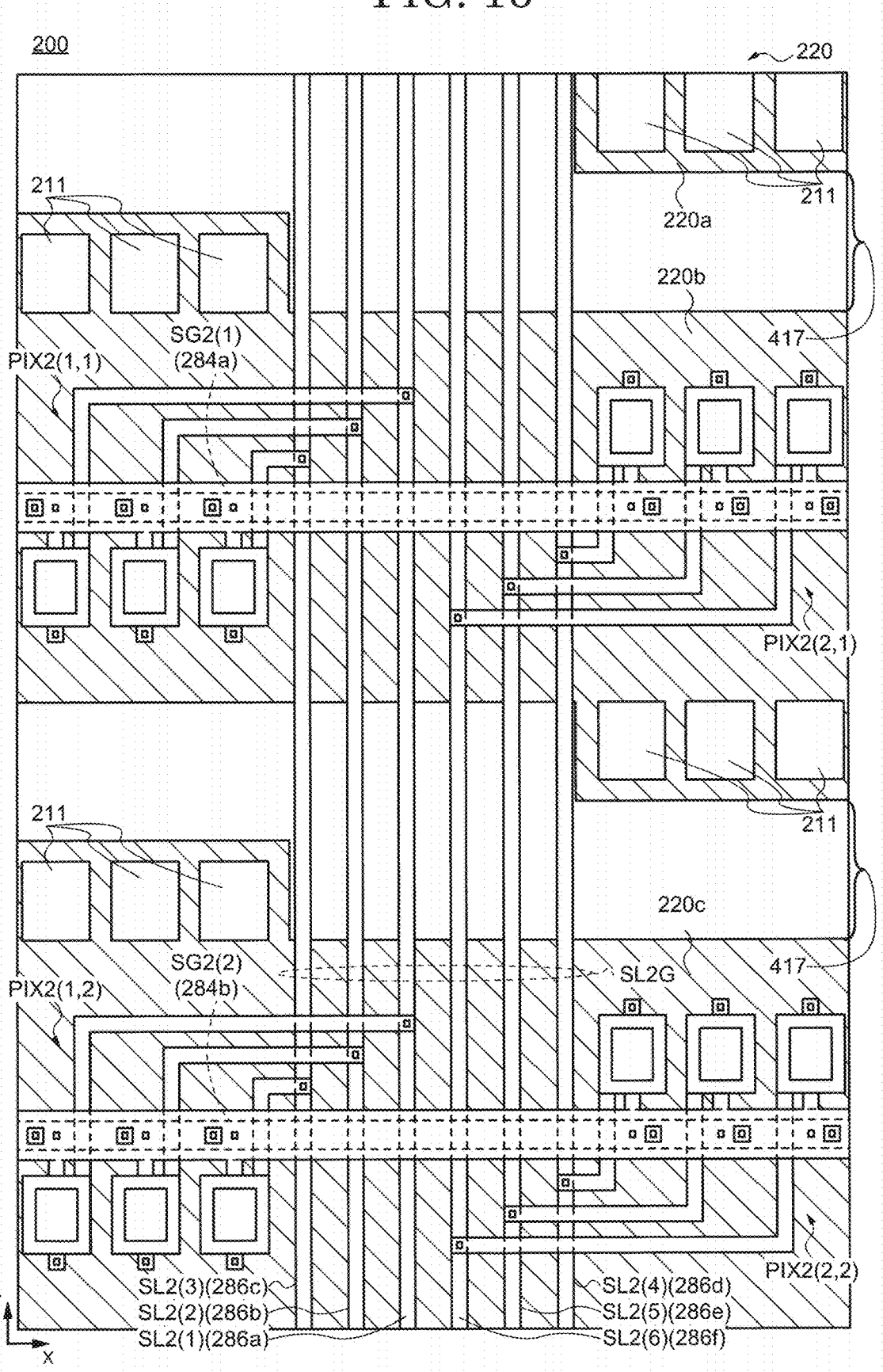
FIG. 16 is a diagram showing a modification of a low reflection heat dissipation layer included in the second display panel according to the first embodiment of the present invention.
Figure 17:
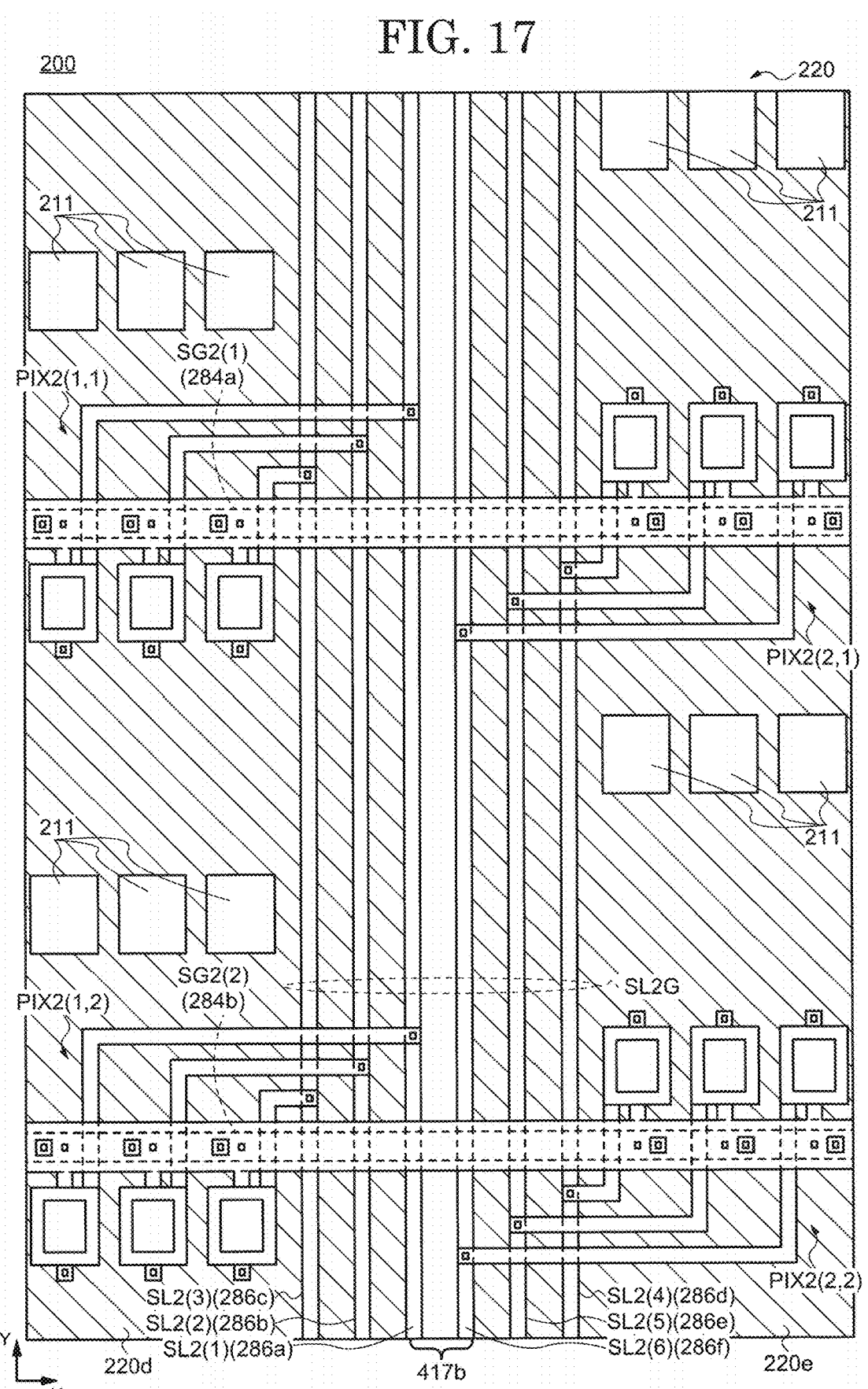
FIG. 17 is a diagram showing a modification of a low reflection heat dissipation layer included in the second display panel according to the first embodiment of the present invention.
Figure 18:
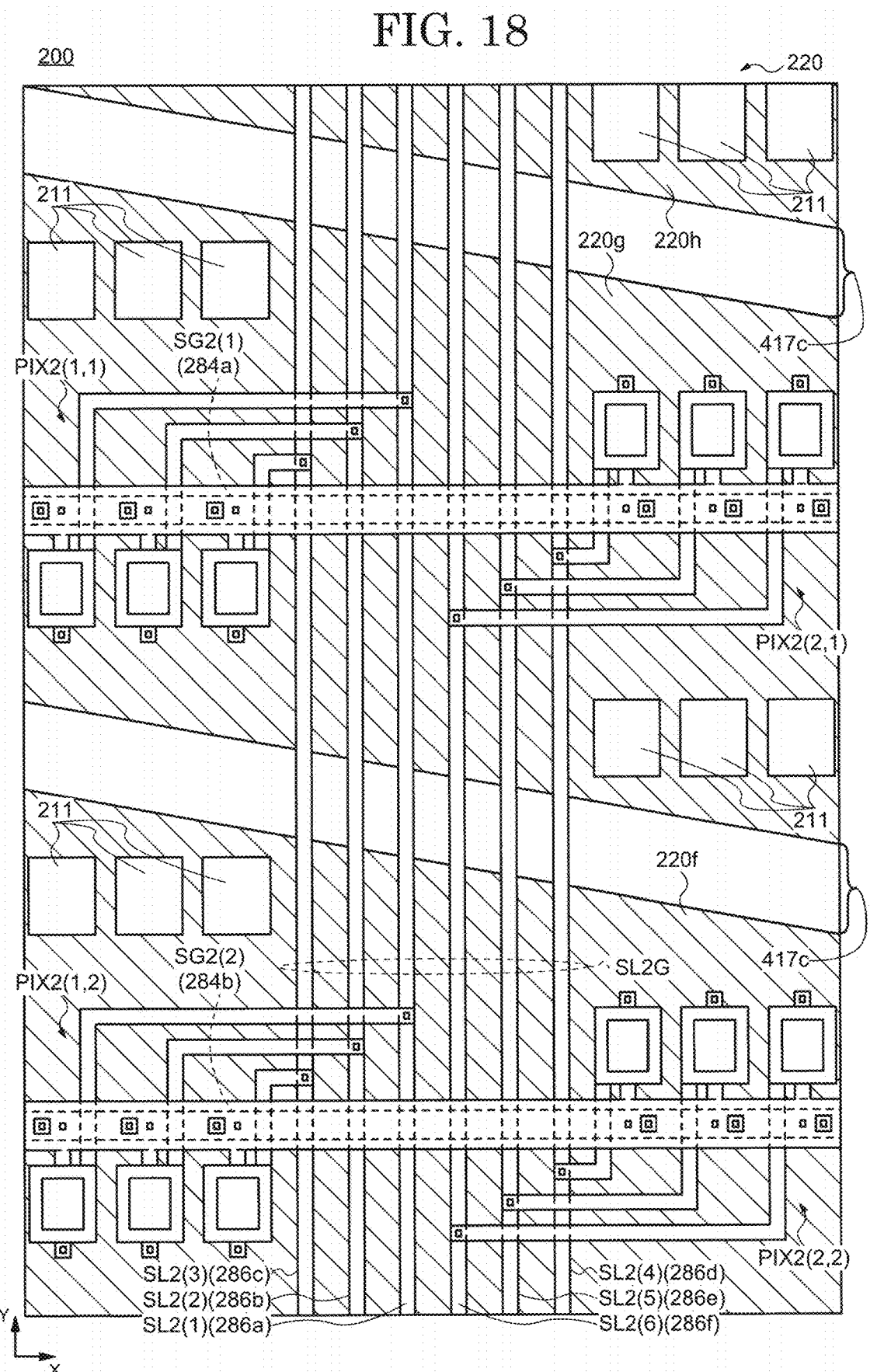
FIG. 18 is a diagram showing a modification of a low reflection heat dissipation layer included in the second display panel according to the first embodiment of the present invention.

A modification of the low reflection heat dissipation layer 220 will be described. FIG. 16, FIG. 17, and FIG. 18 are diagrams showing a modification of the low reflection heat dissipation layers 220 included in the second display panel 200. Descriptions of the same or similar configurations as those in FIG. 1 to FIG. 15 will be omitted.

In the low reflection heat dissipation layer 220 shown in FIG. 16, a low reflection heat dissipation layer 220*a*, a low reflection heat dissipation layer 220*b*, and a low reflection heat dissipation layer 220*c* are arranged on the first surface 212 (see FIG. 2) so as to overlap the scanning signal line 284*a*, the scanning signal line 284*b*, the light-emitting element near the scanning signal line, and the video signal lines 286*a* to 286*f* and to extend in the direction X, and a plurality of slits 417 in which the low reflection heat dissipation layer 220 is not arranged in the direction X of the first surface 212 is included between the low reflection heat dissipation layer 220*a* and the low reflection heat dissipation layer 220*b* and between the low reflection heat dissipation layer 220*b* and the low reflection heat dissipation layer 220*c*. In addition, the low reflection heat dissipation layer 220*a*, the low reflection heat dissipation layer 220*b*, and the low reflection heat dissipation layer 220*c* surround the periphery of the opening 211.

In the low reflection heat dissipation layer 220 shown in FIG. 17, a low reflection heat dissipation layer 220*d* and a low reflection heat dissipation layer 220*e* are arranged on the first surface 212 so as to extend in the direction Y, and a slit 417*b* in which the low reflection heat dissipation layer 220 is not arranged is included between the low reflection heat dissipation layer 220*d* and the low reflection heat dissipation layer 220*e*. In addition, the low reflection heat dissipation layer 220*d* and the low reflection heat dissipation layer 220*e* surround the periphery of the opening 211.

In the low reflection heat dissipation layer 220 shown in FIG. 18, a low reflection heat dissipation layer 220*f*, a low reflection heat dissipation layer 220*g*, and a low reflection heat dissipation layer 220*h* are arranged on the first surface 212 so as to overlap the scanning signal line 284*a*, the scanning signal line 284*b*, the light-emitting elements near the scanning signal lines, and the video signal lines 286*a* to 286*f* and to extend in an oblique direction intersecting the direction X and the direction Y, and a plurality of slits 417*c* in which the low reflection heat dissipation layer 220 is not arranged is included between the low reflection heat dissipation layer 220*f* and the low reflection heat dissipation layer 220*g* and between the low reflection dissipation layer 220*g* and the low reflection heat dissipation layer 220*h*. In addition, the low reflection heat dissipation layer 220*f*, the low reflection heat dissipation layer 220*g*, and the low reflection heat dissipation layer 220*h* surround the periphery of the opening 211.

As shown in FIG. 16 to FIG. 18, even when the slits are included in the low reflection heat dissipation layer 220, since the low reflection heat dissipation layer 220 is connected to the housing, heat generated with the display on the first display panel 100 and the second display panel 200 can be dissipated to the housing 400 through the low reflection heat dissipation layer 220. The slit may be referred to as a groove.

[10. Modification of Arrangement of Pixel PIX1 and Pixel PIX2]

Figure 19A:
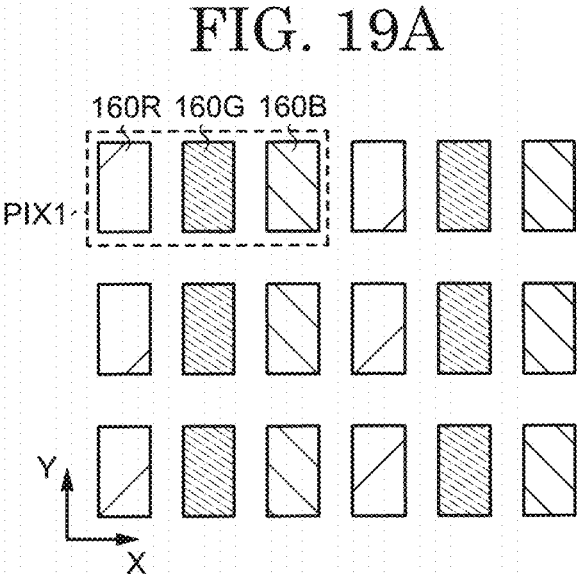
FIG. 19A is a diagram showing an arrangement of pixels according to the first embodiment of the present invention.
Figure 19B:
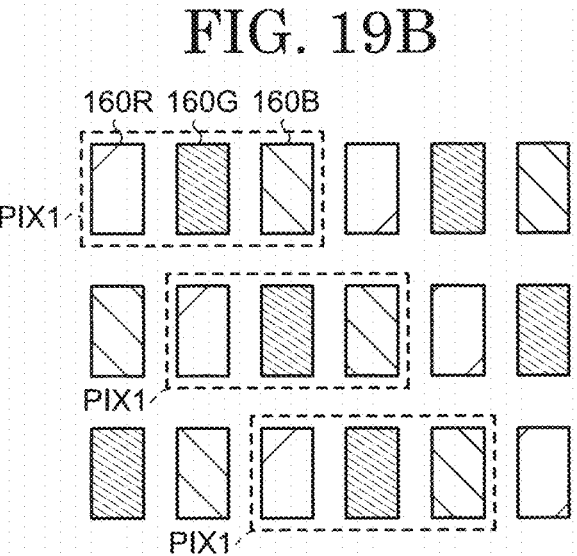
FIG. 19B is a diagram showing an arrangement of pixels according to the first embodiment of the present invention.
Figure 19C:
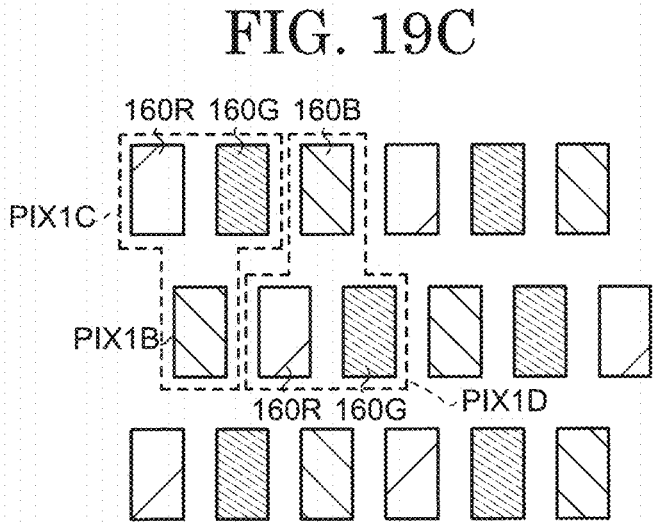
FIG. 19C is a diagram showing an arrangement of pixels according to the first embodiment of the present invention.

A modification of the arrangement of the pixel PIX1 will be described. FIG. 19A, FIG. 19B, and FIG. 19C are diagrams showing a modification of the arrangement of the pixel PIX1. Descriptions of the same or similar configurations as those in FIG. 1 to FIG. 18 will be omitted.

FIG. 19A shows a pixel arrangement in which the pixel PIX1 is arranged in a matrix in the direction X and the direction Y, and the sub-pixel 160R, the sub-pixel 160G, and the sub-pixel 160B are arranged in the direction Y. FIG. 19A shows a pixel arrangement called a stripe arrangement or the like.

FIG. 19B shows a pixel arrangement in which the pixel PIX1 is arranged in a matrix in the direction X and the direction Y, and the sub-pixel 160R, the sub-pixel 160G, and the sub-pixel 160B are arranged in an oblique direction intersecting the direction X and the direction Y, respectively, while being shifted by one sub-pixel in the direction X. FIG. 19B shows a pixel arrangement called a mosaic arrangement or the like.

FIG. 19C shows a pixel arrangement in which a pixel PIX1C in which the sub-pixel 160R, the sub-pixel 160G, and the sub-pixel 160B are arranged so as to constitute an inverted triangle and a pixel PIX1D in which the sub-pixel 160R, the sub-pixel 160G, and the sub-pixel 160B are arranged so as to constitute a triangle are alternately arranged in the direction X and the direction Y. FIG. 19C shows a pixel arrangement called a delta arrangement or the like.

The pixel PIX2 may be arranged in the same manner as the arrangement described with reference to FIG. 19A to FIG. 19C.

As described above, the pixel PIX1 and the pixel PIX2 can be arranged in various ways.

Second Embodiment

Figure 20:
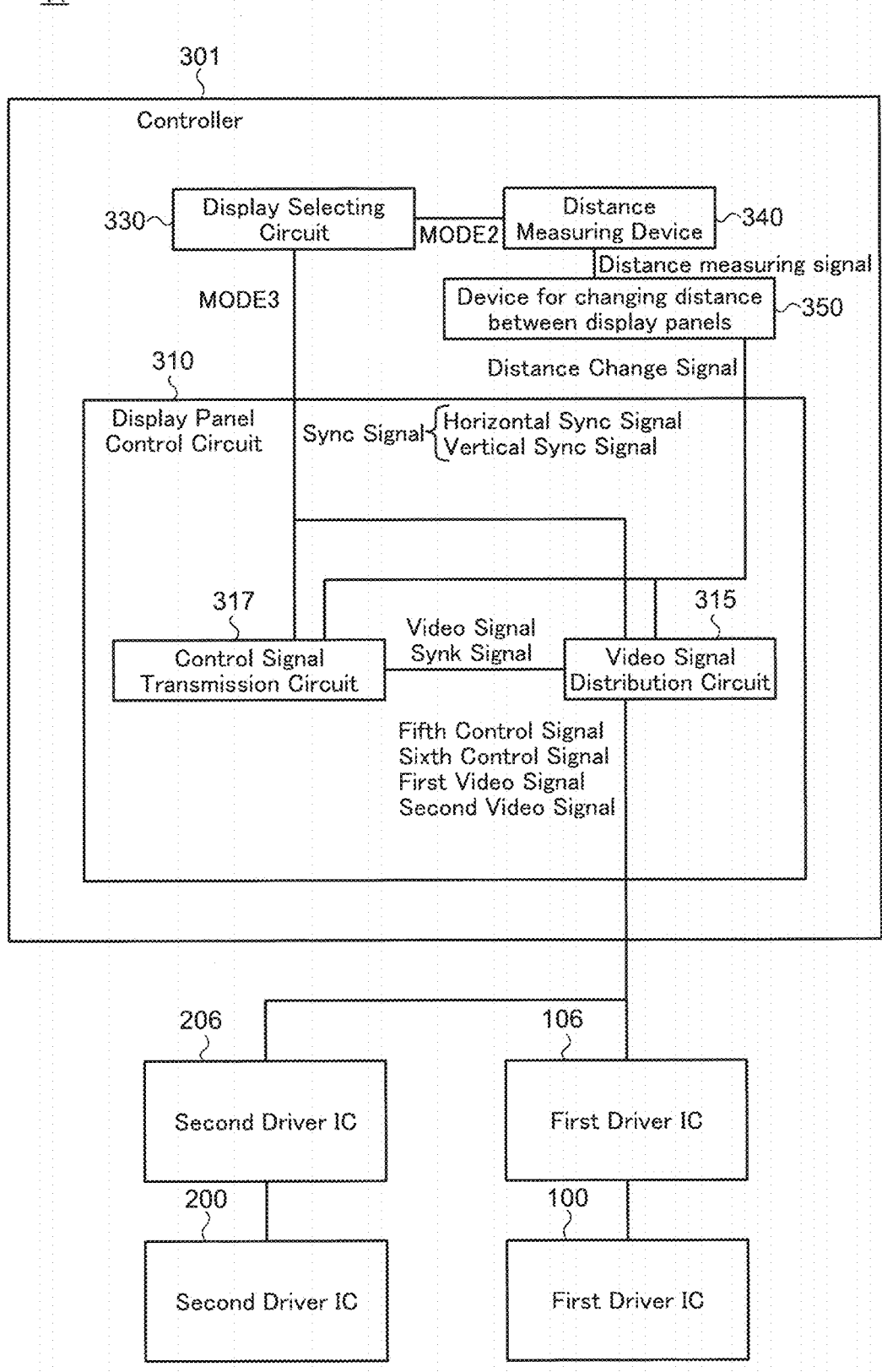
FIG. 20 is a functional block diagram showing the control device in the display device according to the second embodiment of the present invention.
Figure 21:
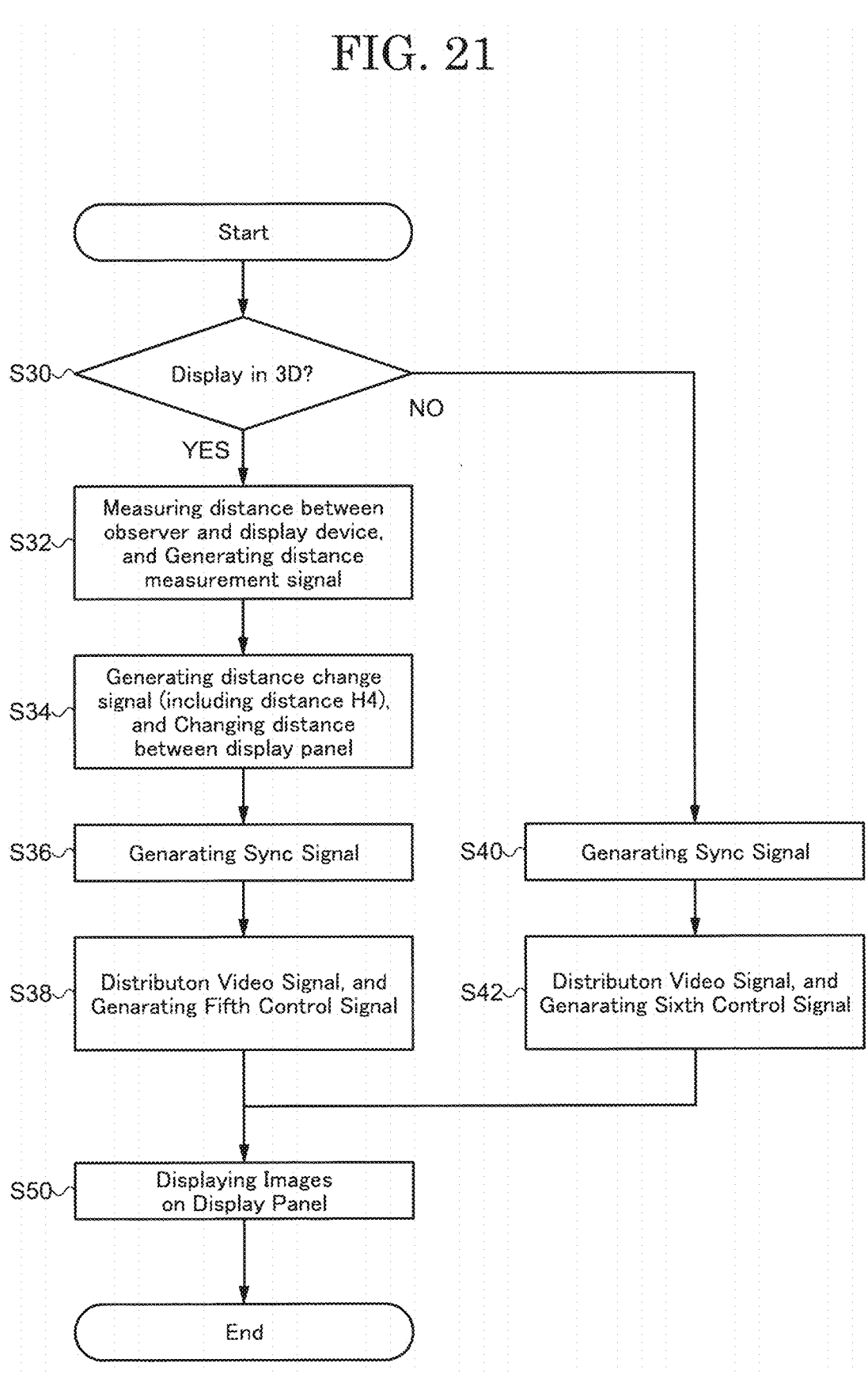
FIG. 21 is a flow chart for explaining a displaying method of the display device according to the second embodiment of the present invention.

A displaying method of a display device 11 different from the first embodiment will be described in the second embodiment. FIG. 20 is a functional block diagram showing a control device 301 in the display device 11 according to the second embodiment of the present invention. FIG. 21 is a flow chart for explaining a displaying method of the display device 11. Descriptions similar to those of the display device 10 may be omitted in the description of the display device 11.

First, a functional block configuration of the display device 11 will be described with reference to FIG. 21. As shown in FIG. 21, the control device 301 includes the display selection circuit 330, a distance measuring device 340, a device for changing distance between display panels 350, and the display panel control circuit 310. The display panel control circuit 310 includes a control signal transmission circuit 317 and a video signal distribution circuit 315.

The display selection circuit 330 has a function of selecting a displaying method of the display device 11 similar to the display device 10. For example, in the case where the display device 11 has a plurality of displaying methods, the user can select a stereoscopic displaying method and a normal displaying method from the plurality of displaying methods by an input function (not shown). The display selection circuit 330 may select a stereoscopic displaying method (MODE2) or a normal displaying method (MODE3) based on an input signal MODE transmitted from the input function, and the display device 11 can initiate the stereoscopic displaying method or the normal displaying method. In addition, the display selection circuit 330 has a function of transmitting the input signal MODE2 containing data of the stereoscopic displaying method to the distance measuring device 340 and transmitting the input signal MODE3 containing data of the normal displaying method to the control signal transmission circuit 317 and the video signal distribution circuit 315.

The distance measuring device 340 has a function capable of measuring a distance between the observer 30 and the display device 11. Specifically, the distance measuring device 340 includes a distance sensor capable of measuring the distance between the observer 30 and the display device 11. The distance measuring device 340 generates a result (distance H3) of measuring the distance between the observer 30 and the display device 11, and transmits a distance measuring signal to the device for changing distance between display panels 350. The distance measuring signal contains data of the distance H3.

The device for changing distance between display panels 350 has a function of changing the distance between the first display panel 100 and the second display panel 200. Specifically, the device for changing distance between display panels 350 generates a distance changing signal according to the distance measuring signal. In addition, the device for changing distance between display panels 350 changes the distance H1 between the first display panel 100 and the second display panel 200 to a distance H4. Furthermore, the device for changing distance between display panels 350 transmits the distance changing signal to the control signal transmission circuit 317 and the video signal distribution circuit 315. The distance changing signal contains data of the distance H4.

The control signal transmission circuit 317 has a function of generating and transmitting a signal for controlling the first driver IC 106 and the second driver IC 206 based on the input signal MODE3 or the distance changing signal. Specifically, upon receiving the input signal MODE3 or the distance changing signal, the control signal transmission circuit 317 generates a synchronization signal for synchronizing the second display panel 200 and the first display panel 100, and transmits the video signal and the synchronization signal to the video signal distribution circuit 315.

The video signal distribution circuit 315 has a function of distributing the video signal to the first video signal for displaying the video signal on the first display panel 100 and the second video signal for displaying the video signal on the second display panel 200 based on the distance changing signal, the video signal and the synchronization signal, or the input signal MODE3, the video signal and the synchronization signal. In addition, the video signal distribution circuit 315 has a function of generating and transmitting the signal for controlling the second driver IC 206 and the first driver IC 106 based on the distance changing signal, the video signal and the synchronization signal, or the input signal MODE3, the video signal and the synchronization signal.

Specifically, upon receiving the distance changing signal, the video signal, and the synchronization signal, the video signal distribution circuit 315 distributes the video signal to the first video signal and the second video signal according to the resolution to which the video signal corresponds at the measured distance (distance H4) between the first display panel and the second display panel 200, and generates a fifth control signal other than the synchronization signal for supplying the first video signal and the second video signal to the first display panel 100 and the second display panel 200. Furthermore, the video signal distribution circuit 315 transmits the fifth control signal including the first video signal, the second video signal, and the synchronization signal to the second driver IC 206 and the first driver IC 106.

In addition, upon receiving the input signal MODE3, the video signal distribution circuit 315 distributes the video signal to the first video signal and the second video signal according to the resolution to which the video signal corresponds at the current distance (distance H1) between the first display panel and the second display panel 200, and generates a sixth control signal other than the synchronization signal for supplying the first video signal and the second video signal to the first display panel 100 and the second display panel 200. Furthermore, the video signal distribution circuit 315 transmits the sixth control signal including the first video signal, the second video signal, and the synchronization signal to the second driver IC 206 and the first driver IC 106.

The fifth control signal and the sixth control signal include signals (synchronization signals) for synchronizing the driving of the first display panel 100 and the driving of the second display panel 200. In addition, the fifth control signal and the sixth control signal include the first synchronization signal and the second synchronization signal for synchronizing the driving timings of the second display panel 200 and the first display panel 100, supplying the second video signal to the second display panel 200, and supplying the first video signal to the first display panel 100.

In addition, the synchronization signal, the first synchronization signal, and the second synchronization signal are signals having the same functions and configurations as those of the control device 300 according to the first embodiment.

Next, a flow of the stereoscopic displaying method and the normal displaying method will be described with reference to FIG. 21.

For example, the stereoscopic displaying method (MODE2) or the normal displaying method (MODE3) of the display device 11 is selected based on the input signal MODE.

In step 30 (S10), the display device 11 uses the display selection circuit 330 to select the displaying method. In the case where the input signal MODE is the input signal MODE2 containing data of the stereoscopic displaying method (MODE2), the display device 10 selects the stereoscopic displaying method (MODE2) (YES in step 30 (S10) and executes step 32 (S32). In the case where the input signal MODE is the input signal MODE3 containing data of the normal displaying method (MODE3), the display device 10 selects the normal displaying method (MODE3) (NO in step 30 (S10) and executes step 42 (S42).

In step 32 (S32), the distance measuring device 340 measures the distance between the observer 30 and the display device 11 and generates the measurement result (distance H3). In addition, the distance measuring device 340 transmits the distance measuring signal containing the data of the distance H3 to the device for changing distance between display panels 350.

In step 34 (S14), the device for changing distance between display panels 350 changes the distance H1 between the first display panel 100 and the second display panel 200 to the distance H4 according to the distance measuring signal. Furthermore, the device for changing distance between display panels 350 transmits the distance changing signal containing the data of the distance H4 to the control signal transmission circuit 317 and the video signal distribution circuit 315.

In step 36 (S36), the control signal transmission circuit 317 generates the synchronization signal based on the distance changing signal. The control signal transmission circuit 317 transmits the video signal and the synchronization signal to the video signal distribution circuit 315.

In step 38 (S38), the video signal distribution circuit 315 distributes the video signal to the first video signal and the second video signal according to the resolution to which the video signal corresponds at the measured distance (distance H4) between the first display panel and the second display panel 200 based on the distance changing signal, the video signal, and the synchronization signal, and generates the fifth control signal other than the synchronization signal. In addition, the video signal distribution circuit 315 transmits the fifth control signal including the first video signal, the second video signal, and the synchronization signal to the second driver IC 206 and the first driver IC 106.

In step 40 (S40), the control signal transmission circuit 317 generates the synchronization signal based on the input signal MODE3 containing the data of the normal displaying method (MODE3). The control signal transmission circuit 317 transmits the video signal and the synchronization signal to the video signal distribution circuit 315.

In step 42 (S42), the video signal distribution circuit 315 distributes the video signal to the first video signal and the second video signal according to the resolution to which the video signal corresponds at the current distance (distance H1) between the first display panel and the second display panel 200 based on the input signal MODE3, the video signal, and the synchronization signal, and generates the fifth control signal other than the synchronization signal. In addition, the video signal distribution circuit 315 transmits the fifth control signal including the first video signal, the second video signal, and the synchronization signal to the second driver IC 206 and the first driver IC 106.

In step 50 (S60) following step 38 (S38) and step 42 (S42), the first driver IC 106 and the second driver IC 206 control the first display panel 100 and the second display panel 200 based on the signals received by the first driver IC 106 and the second driver IC 206.

As described above, the first driver IC 106, the second driver IC 206, the first display panel 100, and the second display panel 200 can be controlled according to the resolution to which the video signal corresponds at the measured distance (distance H4) between the first display panel and the second display panel 200, in the stereoscopic displaying method (MODE2). As a result, the first display panel 100 and the second display panel 200 can display a stereoscopic image according to the measured distance (distance H4) between the first display panel and the second display panel 200.

In addition, the first driver IC 106, the second driver IC 206, the first display panel 100, and the second display panel 200 can be controlled according to the resolution to which the video signal corresponds at the current distance (distance H1) between the first display panel and the second display panel 200, in the normal displaying method (MODE3). As a result, the first display panel 100 and the second display panel 200 can display an image adapted to the resolution according to the current distance (distance H1) between the first display panel and the second display panel 200.

Third Embodiment

Figure 22:
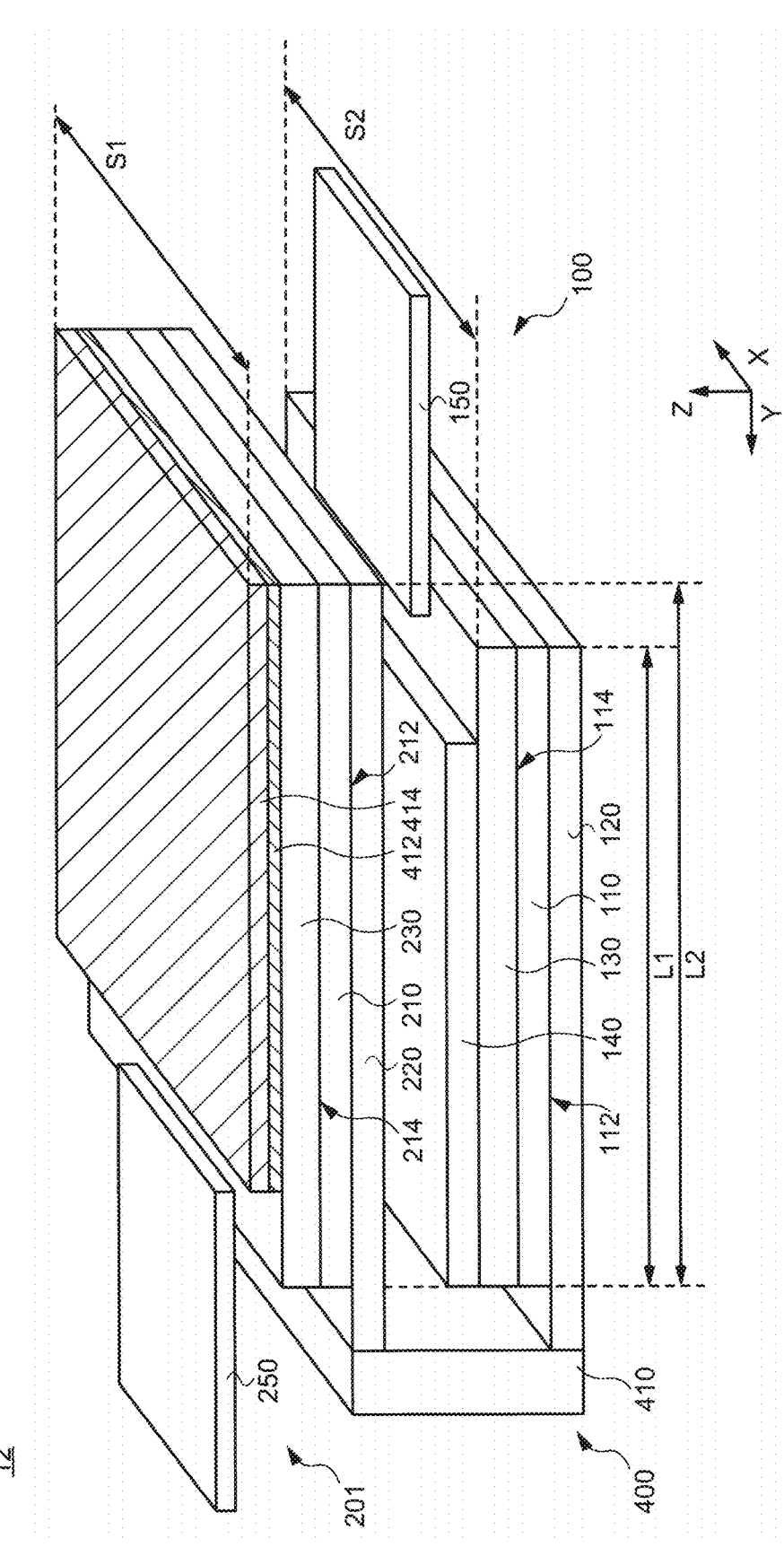
FIG. 22 is a schematic plan view showing a configuration of a display device according to a third embodiment of the present invention.

In a third embodiment, a configuration of a display device 12 different from the first embodiment will be described. FIG. 22 is a schematic perspective view showing a configuration of the display device 12 according to the third embodiment of the present invention. In the description of the display device 12, descriptions similar to those of the display device 10 may be omitted.

The display device 12 does not include the insulating layer 240 and the insulating layer 248, as compared with the display device 10, and includes a conductive adhesive 412 and a circularly polarizing plate 414. Since the insulating layer 248 is replaced with the conductive adhesive 412 and the insulating layer 240 is replaced with the circularly polarizing plate 414, and the other configurations and functions of the display device 12 are the same as those of the display device 10, descriptions of the same configurations and functions as those of the display device 10 will be omitted.

The conductive adhesive 412 is arranged above the array layer 230. The circularly polarizing plate 414 is arranged above the conductive adhesive 412 and adhered to the array layer 230.

An ESD can be suppressed from entering the display device 12 by using the conductive adhesive 412 in the display device 12. As a result, damage to the elements in the display device 12 or wirings or the like caused by the ESD can be suppressed.

In addition, the circularly polarizing plate 414 is arranged on the observer 30 side in the display device 12. As a result, excessive reflection toward the observer 30 side can be suppressed.

Fourth Embodiment

Figure 23:
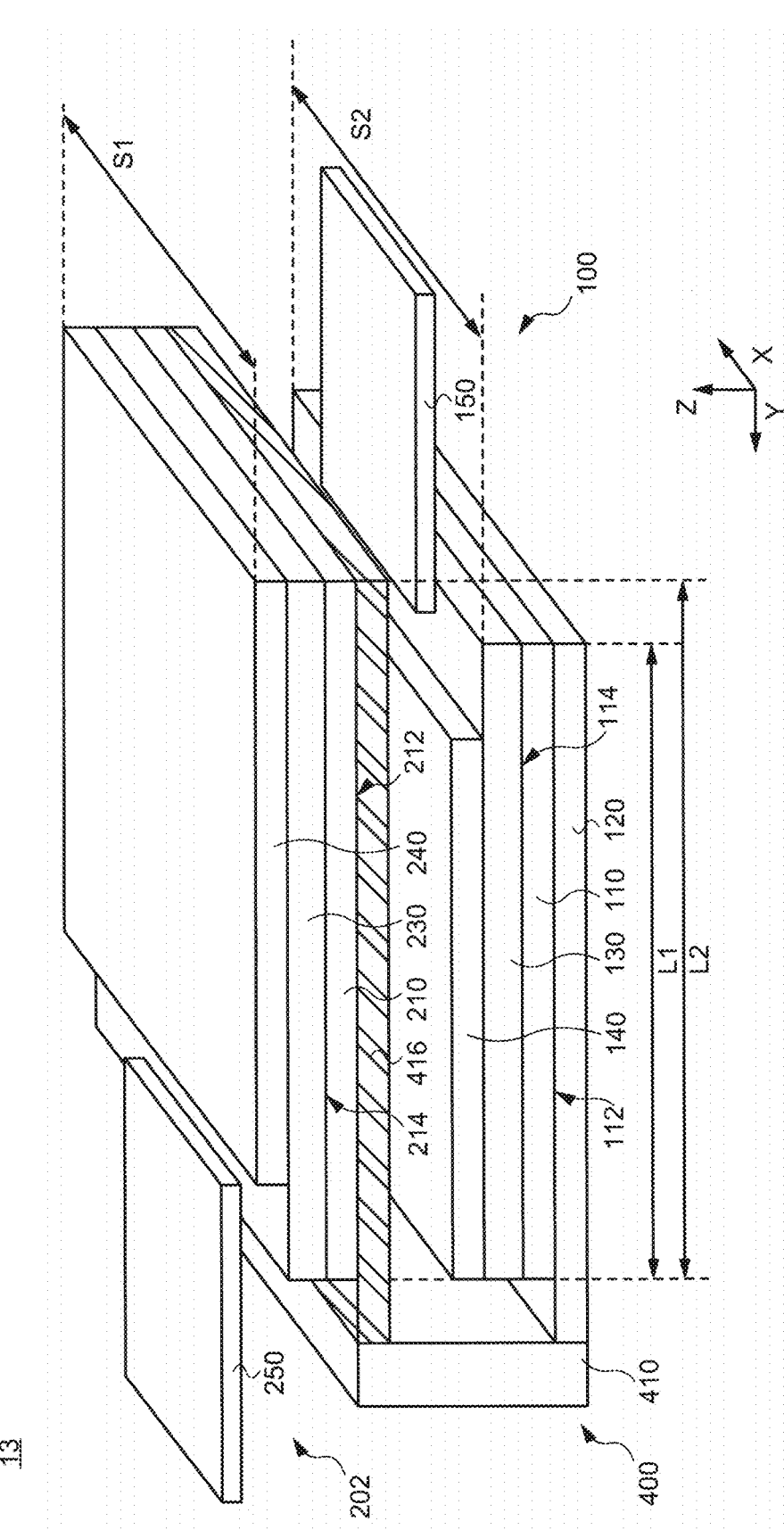
FIG. 23 is a schematic plan view showing a configuration of a display device according to a fourth embodiment of the present invention.

A configuration of a display device 13 different from the first embodiment will be described in a fourth embodiment. FIG. 23 is a schematic perspective view showing a configuration of the display device 13 according to the fourth embodiment of the present invention. Descriptions similar to those of the display device 10 may be omitted in the description of the display device 13.

The display device 13 does not include the low reflection heat dissipation layers 220, as compared with the display device 10, and includes an insulating layer 416. Since other configurations and functions are the same as those of the display device 10 in the display device 13, descriptions of the same configurations and functions as those of the display device 10 will be omitted.

The insulating layer 416 is arranged on the first surface 212 of the substrate 210. The insulating layer 416 is formed using a material having low reflectance and high thermal conductivity. For example, the material of the insulating layer 416 may be formed using alumina ($Al_2O_3$). In addition, the insulating layer 416 and the substrate 210 may be different substrates. For example, the insulating layer 416 may be an alumina sheet ($Al_2O_3$) or a member with a low-reflectivity material on the surface of aluminum nitride (AlN). In the case where the insulating layer 416 is a substrate different from the substrate 210, the substrate may be bonded to the substrate 210 using an adhesive or the like.

The display device 13 has a configuration in which heat is dissipated (a configuration capable of heat dissipation) by using the insulating layer 416. As a result, the display device 13 can suppress a decrease in luminous efficacy of each light-emitting element due to heat generated with the display on the first display panel 100 and the second display panel 200. Furthermore, the display device 10 can increase the amount of current flowing through each light-emitting element and can set the brightness of the light-emitting element high.

Fifth Embodiment

Figure 24:
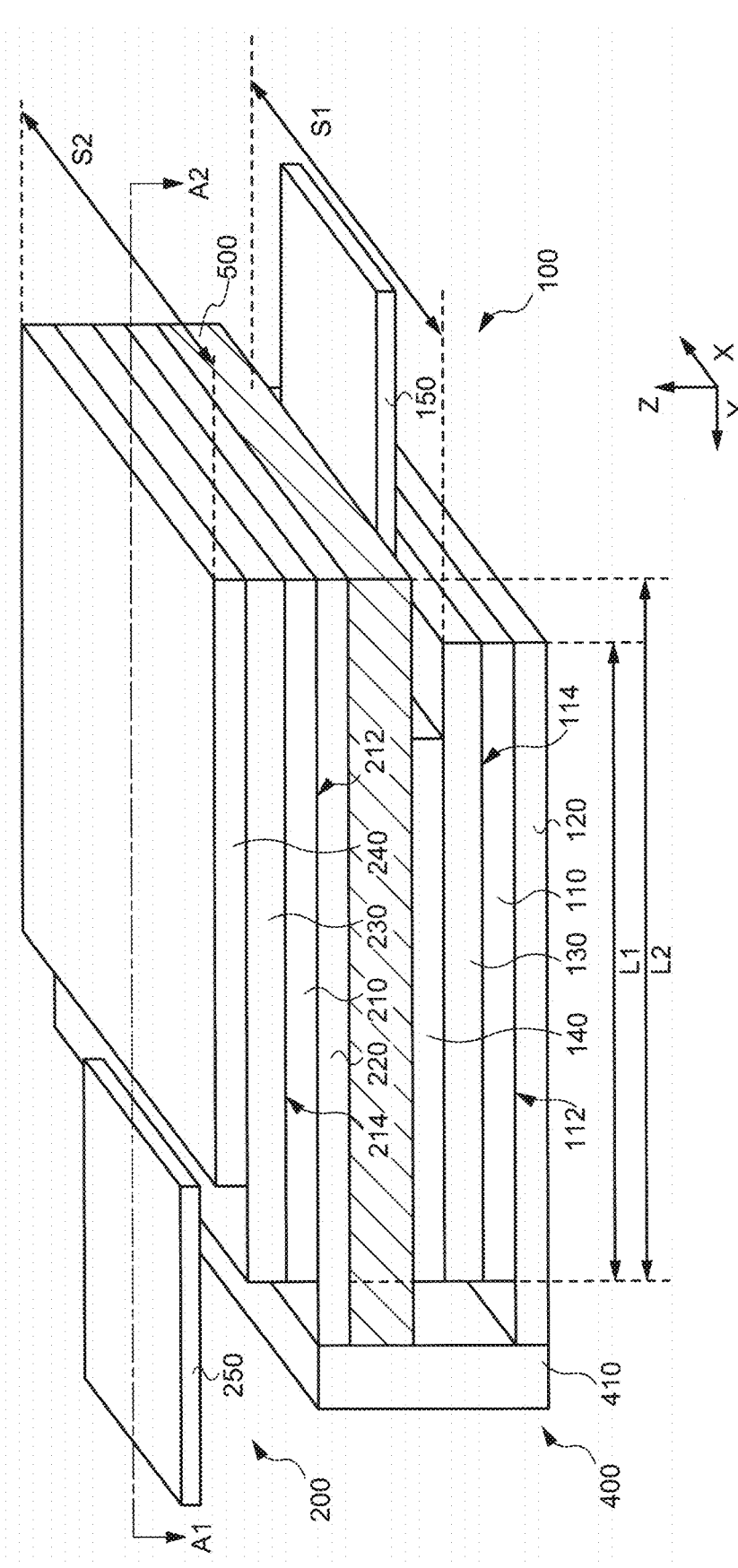
FIG. 24 is a schematic plan view showing a configuration of a display device according to a fifth embodiment of the present invention.

In a fifth embodiment, a configuration of a display device 14 different from the first embodiment will be described. FIG. 24 is a schematic perspective view showing a configuration of the display device 14 according to the fifth embodiment of the present invention. Descriptions similar to those of the display device 10 may be omitted in the description of the display device 14.

The display device 14 includes a high thermal conductivity substrate 500 between the first display panel 100 and the second display panel 200 as compared with the display device 10. Since other configurations and functions are the same as those of the display device 10 in the display device 14, descriptions of the same configurations and functions as those of the display device 10 will be omitted.

The high thermal conductivity substrate 500 is arranged between the insulating layer 140 and the low reflection heat dissipation layers 220. In addition, the high thermal conductivity substrate 500 is also connected to the side wall 410 of the housing 400. The high thermal conductivity substrate 500 is formed using a material having low reflectance and high thermal conductivity. For example, the high thermal conductivity substrate 500 may be a substrate formed using alumina ($Al_2O_3$), or may be a substrate formed using aluminum nitride (AlN).

The display device 13 has a configuration in which heat is dissipated (a configuration capable of heat dissipation) by using the high thermal conductivity substrate 500. As a result, the display device 13 can suppress a decrease in luminous efficacy of each light-emitting element due to heat generated with the display on the first display panel 100 and the second display panel 200. Furthermore, the display device 10 can increase the amount of current flowing through each light-emitting element and can set the brightness of the light-emitting element high.

Each of the embodiments described above as an embodiment of the present invention can be appropriately combined and implemented as long as no contradiction is caused. Further, the addition, deletion, or design change of components, or the addition, deletion, or condition change of process as appropriate by those skilled in the art based on each embodiment are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A display device comprising;
a first substrate including a first surface and a second surface opposite to the first surface, a first LED chip included in a first pixel, a first flexible printed circuit, and a first wiring connected to the first LED chip and the first flexible printed circuit being arranged on the second surface;
a second substrate including a third surface and a fourth surface opposite to the third surface, a second LED chip included in a second pixel, a second flexible printed circuit, and a second wiring connected to the second LED chip and the second flexible printed circuit being arranged on the fourth surface;
a first heat dissipation layer;
a second heat dissipation layer; and
a third heat dissipation layer,
wherein
the second surface faces the third surface,
the second wiring overlaps the first wiring,
the second LED chip and the first LED chip are arranged side-by-side in a plan view,
the first heat dissipation layer is arranged on a first surface side,
the second heat dissipation layer includes a first opening overlapping the first LED chip, and is arranged on the second surface side, and
the third heat dissipation layer includes a second opening overlapping the first LED chip and the first opening, and is arranged on a third surface side.

2. The display device according to claim 1, wherein the first flexible printed circuit is arranged at an end of a second surface side, and
the second flexible printed circuit is arranged at an end of a fourth surface side opposite to the first flexible printed circuit.

3. The display device according to claim 1, wherein a size of the second LED chip is larger than a size of the first LED chip.

4. The display device according to claim 1, wherein a reflectance of each of the first heat dissipation layer, the second heat dissipation layer and the third heat dissipation layer is 10% or less in the wavelength range of visible light.

5. The display device according to claim 4, further comprising:
a circularly polarizing plate; and
a conductive film arranged on the circularly polarizing plate,
wherein
the circularly polarizing plate is arranged on the fourth surface side, and
the conductive film is arranged between the circularly polarizing plate and the fourth surface.

6. The display device according to claim 1, wherein the third heat dissipation layer overlaps the first flexible printed circuit and the second flexible printed circuit, and
a length of the third heat dissipation layer in a first direction is longer than a length of the first heat dissipation layer in the first direction and a length of the second heat dissipation layer in the first direction.

7. The display device according to claim 1, further comprising;
a housing,
wherein
the housing is arranged to surround the first substrate and the second substrate, and is connected to the first heat dissipation layer, the second heat dissipation layer, and the third heat dissipation layer.

8. The display device according to claim 7, further comprising:
a fourth heat dissipation layer,
wherein
the fourth heat dissipation layer includes a third opening overlapping the second LED chip and a fourth opening overlapping the first LED chip, the first opening, and the second opening,
the fourth heat dissipation layer is arranged on the fourth surface side and is connected to the housing, and
a reflectance of the fourth heat dissipation layer is 10% or less in the wavelength range of the visible light area.

9. The display device according to claim 8, wherein a size of the first opening and a size of the second opening are larger than a size of the fourth opening.

10. The display device according to claim 8, further comprising:
a first driving circuit to drive the first LED chip;
a second driving circuit to drive the second LED chip; and
a control circuit configured to control the first driving circuit and the second driving circuit, and to supply different video signals to the first wiring and the second wiring, respectively.

11. The display device according to claim 10, further comprising:
a distance measuring device capable of measuring a distance between a user who can visually recognize the display device and the display device; and
a device for changing distance capable of adjusting a distance between the first substrate and the second substrate according to the distance measured by the distance measuring device.

12. The display device according to claim 7, wherein the third heat dissipation layer is arranged to overlap the third surface except for the second opening.

13. The display device according to claim 7, wherein the third heat dissipation layer includes a plurality of first grooves parallel to a first direction in a plan view.

14. The display device according to claim 7, wherein the third heat dissipation layer includes a plurality of second grooves parallel to a second direction intersecting the first direction in a plan view.

15. The display device according to claim 7, wherein the third heat dissipation layer includes a plurality of third grooves parallel to both the first direction and the second direction intersecting the first direction in a plan view.

16. The display device according to claim 7, further comprising:
a third substrate,
wherein
the third substrate is arranged between the second heat dissipation layer and the third heat dissipation layer, and is in contact with the second heat dissipation layer and the third heat dissipation layer.

17. A display device comprising:
a first substrate including a first surface and a second surface opposite to the first surface, a first LED chip included in a first pixel, a first flexible printed circuit, and a first wiring connected to the first LED chip and the first flexible printed circuit being arranged on the second surface;
a second substrate including a third surface and a fourth surface opposite to the third surface, a second LED chip included in a second pixel, a second flexible printed circuit, and a second wiring connected to the second LED chip and the second flexible printed circuit being arranged on the fourth surface;
a third LED chip;
a fourth LED chip;
a fifth LED chip;
a sixth LED chip;

a third wiring connected to the third LED chip and the first flexible printed circuit;
a fourth wiring connected to the fourth LED chip and the first flexible printed circuit;
a fifth wiring connected to the fifth LED chip and the second flexible printed circuit; and
a sixth wiring connected to the sixth LED chip and the second flexible printed circuit,
wherein
the third LED chip, the fourth LED chip, the third wiring, and the fourth wiring are arranged on the second surface,
the fifth LED chip, the sixth LED chip, the fifth wiring, and the sixth wiring are arranged on the fourth surface,
the first pixel includes the first LED chip, the third LED chip, and the fourth LED chip,
the second pixel includes the second LED chip, the fifth LED chip, and the sixth LED chip,
the second surface faces the third surface,
the second wiring overlaps the first wiring, and
the second LED chip and the first LED chip are arranged side-by-side in a plan view.

18. The display device according to claim 17, wherein an arrangement of the first LED chip, the third LED chip and the fourth LED chip, and the arrangement of the second LED chip, the fifth LED chip and the sixth LED chip are a stripe arrangement, a mosaic arrangement, or a delta arrangement.

19. The display device according to claim 17, further comprising:
a plurality of the first pixels and a plurality of the second pixels;
wherein
the plurality of the first pixels is arranged in a first direction and a second direction intersecting the first direction,
the plurality of the second pixels is arranged in the first direction and the second direction, and
a pitch of the plurality of the first pixels is the same as a pitch of the plurality of the second pixels.

* * * * *